(12) United States Patent
Hrivnak et al.

(10) Patent No.: US 10,804,873 B1
(45) Date of Patent: *Oct. 13, 2020

(54) AUTOMATIC IMPEDANCE MATCHING SYSTEM, METHOD AND APPARATUS

(71) Applicant: Palstar, Inc., Piqua, OH (US)

(72) Inventors: Paul Hrivnak, Piqua, OH (US); John L. Keith, Gilmer, TX (US); Paul N. Katz, Georgetown, TX (US)

(73) Assignee: PALSTAR, INC., Piqua, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/844,791

(22) Filed: Apr. 9, 2020

Related U.S. Application Data

(63) Continuation of application No. 16/521,911, filed on Jul. 25, 2019, now Pat. No. 10,680,574, which is a continuation-in-part of application No. 16/443,139, filed on Jun. 17, 2019, now Pat. No. 10,483,946.

(60) Provisional application No. 62/839,043, filed on Apr. 26, 2019.

(51) Int. Cl.
| H04B 1/02 | (2006.01) |
| H03H 7/40 | (2006.01) |
| H01Q 1/50 | (2006.01) |
| H03H 11/04 | (2006.01) |
| H03H 7/01 | (2006.01) |
| H03H 11/30 | (2006.01) |

(52) U.S. Cl.
CPC ............... *H03H 7/40* (2013.01); *H01Q 1/50* (2013.01); *H03H 7/0115* (2013.01); *H03H 11/04* (2013.01); *H03H 11/30* (2013.01)

(58) Field of Classification Search
CPC ...... H04B 1/0458; H04B 1/04; H03H 7/1775; H03H 7/38; H03H 7/42; H03H 7/468; H03H 9/0004; H03H 11/04; H03H 11/30
See application file for complete search history.

(56) References Cited

U.S. PATENT DOCUMENTS

| 1,038,931 | A | | 8/1919 | Silva-Martinez | |
| 3,995,237 | A | | 11/1976 | Brunner | 333/17.3 |
| 4,486,722 | A | * | 12/1984 | Landt | H03H 7/40 327/503 |
| 4,965,607 | A | | 10/1990 | Wilkins | 343/861 |
| 7,724,484 | B2 | | 5/2010 | Bahl | 361/56 |
| 10,389,316 | B1 | * | 8/2019 | Silva-Martinez | H03F 3/45475 |
| 10,483,946 | B1 | | 11/2019 | Hrivnak et al. | |
| 2008/0106349 | A1 | | 5/2008 | Mckinzie et al. | 333/17.3 |

(Continued)

OTHER PUBLICATIONS

Instruction Manual for MFJ IntelliTuner Automatic Antenna Tuner, Model MFJ-994B, 48 pages, 2012.

(Continued)

*Primary Examiner* — Tuan Pham
(74) *Attorney, Agent, or Firm* — Slayden Grubert Beard PLLC

(57) ABSTRACT

Automatic impedance matching measures the RF source frequency and RF load voltage, current and phase to determine a single match solution for a capacitive value of the variable capacitor and an inductive value for the variable inductor, and whether a shunt reactance is coupled to the RF source or RF load. Once the capacitance and inductance values for a match solution are determined they are contemporaneously selected without any iterative searching necessary for the match solution.

6 Claims, 31 Drawing Sheets

(56) References Cited

U.S. PATENT DOCUMENTS

2012/0051409 A1   3/2012   Brobston et al. ............. 375/222
2014/0051477 A1   2/2014   Zhang et al. ............. 455/552.1
2018/0342798 A1  11/2018   Lin ......................... H01Q 1/44
2019/0158039 A1*  5/2019   Koya ..................... H03G 3/004
2019/0238164 A1   8/2019   Takenaka et al.

OTHER PUBLICATIONS

Instruction Manual for MFJ Legal Limit IntelliTuner Remote Automatic Antenna Tuner, Model MFJ-998RT, 28 pages, 2011.
ICOM Service Manual HF+MHz Automatic Antenna Turner AH-4, 23 pages, 1998.
SEA 1612C/121612WX/1617WX, Automatic Antenna Tuner, Instruction and Maintenance Manual, 22 pages, 1998, Aug. 1, 2009.
SGC SG-230 Smarttuner Microprocessor Controlled Automatic Antenna Coupler, Installation and Operations Manual, 81 pages, Nov. 1, 2000.
SEA 1612C/1612W/1612WX, Automatic Antenna Tuner, Instruction and Maintenance Manual, 43 pages, Jul. 1, 2001.
Search Report for International Application No. PCT/US2020/020344, 12 pages, dated Jun. 26, 2020.

* cited by examiner

L-Matching network.

$$+j\omega L = \sqrt{(R_{LO})(R_{HI}) - (R_{LO})^2} \quad (1.1)$$

$$-j\omega C = [(R_{LO})(R_{HI})/+j\omega L]^{-1} \quad (1.2)$$

$$i_L(rms) = \sqrt{P/R_{LO}} \quad (1.3)$$

$$v_L(pk) = +j\omega L\sqrt{2P/R_{LO}} \quad (1.4)$$

$$v_C(pk) = \sqrt{2PR_{HI}} \quad (1.5)$$

$$i_C(rms) = \frac{\sqrt{PR_{HI}}}{-j\omega C} \quad (1.6)$$

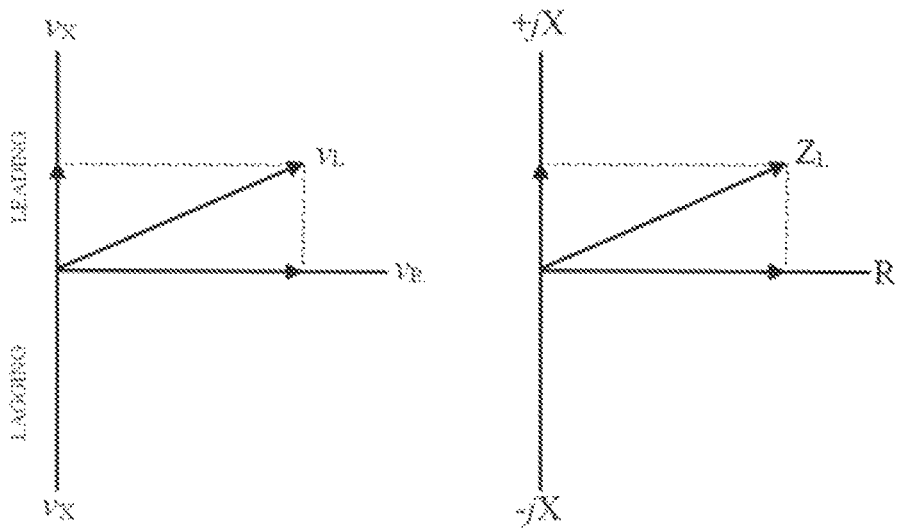

(a) Vector plots representing the measured voltage and current and the resultant impedance calculations result.

(b) Equations to calculate Load Impedance and convert to equivalent R and X.

$$Z_L = \frac{V_L}{I_L} \qquad R = (\cos \Theta)(Z_L) \qquad X = (\sin \Theta)(Z_L) \angle \Theta$$

Example Calculations:

$V_L = 30V$ (measured)     $I_L = 1.5A$ (measured)     $\Theta = 30°$ (measured)

$$Z_L = \frac{30V \angle 30°}{1.5A} \quad \text{so, } Z_L = 20 \angle 30° \, \Omega$$

$R = (\cos 30°)(20\Omega)$ so, $R = 17.3\Omega$ $X = (\sin 30°)(20\Omega)$ so, $R = 10 \angle 90° \, \Omega$ which, when written in polar form is $17.3 + j10\Omega$

FIGURE 13

All relays controlled by Calculation & Control Circuits 632a, 632b

AUTOMATIC IMPEDANCE MATCHING SYSTEM, METHOD AND APPARATUS

RELATED PATENT APPLICATION

This application is a continuation of U.S. patent application Ser. No. 16/521,911, filed Jul. 25, 2019; and claims priority thereto, which is a continuation-in-part of U.S. patent application Ser. No. 16/443,139, filed Jun. 17, 2019, now U.S. Pat. No. 10,483,946 B1; issued Nov. 19, 2019; and claims priority thereto, and which claims priority to U.S. Provisional Patent Application Ser. No. 62/839,043; filed Apr. 26, 2019; wherein all are hereby incorporated by reference herein for all purposes.

TECHNICAL FIELD

The present disclosure relates to impedance matching, and, in particular, to matching a radio frequency load having a second impedance to a radio frequency source having a first impedance wherein there is only one match solution for each frequency of operation.

BACKGROUND

Maximum power transfer occurs when an alternating current (AC) generator output impedance matches a load impedance. For radio frequency (RF) applications this is especially important as RF generating devices are most efficient when operating at their design impedance. A subset of RF generating devices may be, for example but are not limited to, RF transmitters and power amplifiers, and a subset of RF loads may be antennas used for transmitting RF. Generally, RF transmitters operating in the high frequency (HF), very-high frequency (VHF), ultra-high frequency (UHF), and microwave bands require a well-defined load impedance, e.g., 50-ohm or 75-ohm, to efficiently operate into for maximum RF power transfer. However, most antennas are not 50 or 75 ohms except at some specific frequency when carefully designed and adjusted to that frequency and load impedance. Therefore, to match the load impedance of a transmitting antenna to the output impedance of a RF transmitter an antenna matching network or "antenna coupler" may be used between the transmitter and antenna when the transmitter and antenna must operate at several different frequencies.

Typically, an inductor-capacitor (L-C) matching network is required which may be configured as a T-network (FIG. 1), also known as a high pass filter, or an L-network (FIG. 2) which may be configured as a low pass filter. Another configuration of the L-network is the it-network (FIG. 3) which has a first capacitor on the source side and a second capacitor on the load side.

The T-network has the following issues: a) there may be multiple L-C matching solution combinations which may have significant component stresses due to high RF currents and/or voltages, b) a "correct" (best) matching solution may be difficult to find, and c) the T-network requires more components to provide the correct matching solutions. The L-network may require unusually large values of inductance and/or capacitance, and the it-network, like the T-network, requires more components to provide the correct matching solutions.

Present technology automatic antenna matching networks will do an iterative selection of capacitance and inductance values until a match between the RF load and RF source is found, e.g., lowest voltage-standing-wave-ratio (VSWR). This, however, may take seconds and many sequential relay operations to achieve.

SUMMARY

Hence, there is a need for an impedance matching system, method and apparatus to maximize power transfer between a source and load that does not suffer from the limitations of having multiple matching solutions, significant component stresses due to high currents and/or voltages, and require many sequential relay operations over a number of seconds of time to find an impedance match solution.

According to an embodiment, a method for matching an impedance of a radio frequency (RF) load to an impedance of a RF source may comprise the steps of: (a) coupling a RF attenuator between a RF source and a RF load; (b) measuring the RF source frequency and the RF load voltage, current and phase; (c) determining inductance and capacitance values required to match the RF load impedance to the RF source impedance using the measured frequency, voltage, current and phase; (d) setting a variable inductor to the determined inductance value and a variable capacitor to the determined capacitance value; (e) coupling an impedance matching network between the RF source and the RF load, wherein the impedance matching network may comprise the variable inductor and the variable capacitor; and (f) decoupling the RF attenuator from between the RF source and the RF load.

According to a further embodiment of the method, may comprise the step of determining a connection configuration for the variable capacitor and variable inductor of the impedance matching network, wherein the impedance matching network may be configured for either the RF load impedance being greater than the RF source impedance or the RF load impedance being less than the RF source impedance. According to a further embodiment of the method, may comprise: in step (c) the step of determining inductance and capacitance values required to match the RF load impedance to N times the RF source impedance using the measured frequency, voltage, current and phase; and in step (e) further coupling a 1:N step-up impedance transformer between the RF source and the impedance matching network.

According to a further embodiment of the method, may comprise the step of coupling a voltage standing wave ratio (VSWR) detector between the RF source and the matching network. According to a further embodiment of the method, may comprise redoing steps (a)-(f) when a VSWR greater than a certain VSWR value may be detected. According to a further embodiment of the method, the certain VSWR value may be 2:1.

According to a further embodiment of the method, may comprise the step of increasing the RF load impedance with a step-up impedance transformer coupled between the RF load and the matching network. According to a further embodiment of the method, may comprise the step of decreasing the RF load impedance with a step-down impedance transformer coupled between the RF load and the matching network.

According to another embodiment, a method for matching an impedance of a radio frequency (RF) load to an impedance of a RF source, said method may comprise the steps of: (a) coupling a RF attenuator between a RF source and a RF load; (b) measuring the RF source frequency and the RF load voltage, current and phase; (c) determining inductance and capacitance values required to match the RF load impedance to the RF source impedance using the measured frequency, voltage, current and phase; (d) setting a variable inductor to the determined inductance value and a variable capacitor to the determined capacitance value; (e) coupling an impedance matching network between the RF attenuator and the RF load, wherein the impedance matching network may comprise the variable inductor and the variable capacitor; and (f) decoupling the RF attenuator from between the RF source and the matching network, whereby the matching network may be coupled between the RF source and the RF load.

According to a further embodiment of the method, may comprise the step of determining a connection configuration for the variable capacitor and variable inductor of the impedance matching network, wherein the impedance matching network may be configured for either the RF load impedance being greater than the RF source impedance or the RF load impedance being less than the RF source impedance.

According to a further embodiment of the method, may comprise: in step (c) the step of determining inductance and capacitance values required to match the RF load impedance to N times the RF source impedance using the measured frequency, voltage, current and phase; in step (e) further coupling a 1:N step-up impedance transformer between the RF attenuator and the impedance matching network; and in step (f) decoupling the RF attenuator from between the RF source and the 1:N step-up impedance transformer, whereby the 1:N step-up impedance transformer and the matching network may be coupled between the RF source and the RF load.

According to a further embodiment of the method, may comprise the step of coupling a voltage standing wave ratio (VSWR) detector between the RF source and the matching network. According to a further embodiment of the method, may comprise redoing steps (a)-(f) when a VSWR greater than a certain VSWR value may be detected. According to a further embodiment of the method, the certain VSWR value may be 2:1.

According to a further embodiment of the method, may comprise the step of increasing the RF load impedance with a step-up impedance transformer coupled between the RF load and the matching network. According to a further embodiment of the method, may comprise the step of decreasing the RF load impedance with a step-down impedance transformer coupled between the RF load and the matching network.

According to yet another embodiment, a system for matching an impedance of a radio frequency (RF) load to an impedance of a RF source may comprise: a frequency detector for determining a frequency of a RF source; voltage, current and phase detectors for determining voltage, current and phase of a RF load; a RF attenuator coupled to the frequency, voltage, current and phase detectors; an impedance matching network comprising a variable capacitor and a variable inductor; a measurement, calculation and control circuit coupled to the frequency, voltage, current and phase detectors, and the variable capacitor and the variable inductor; wherein from the frequency of the RF source and the voltage, current and phase of the RF load, the measurement, calculation and control circuit calculates capacitance and inductance values required for the variable capacitor and the variable inductor to match the impedance of the RF load to the RF source impedance, and then sets the variable capacitor and the variable inductor to the capacitance and inductance values, respectively; a first switch coupled between the RF source and the RF attenuator; a second switch for coupling when closed or decoupling when open the RF attenuator, frequency, voltage, current and phase detectors to or from the RF load; a third switch coupled between the RF source and the impedance matching network; and a fourth switch coupled between the impedance matching network and the RF load; wherein the first and second switches may be closed, and the third and fourth switches may be open during calculation of the capacitance and inductance values and setting of the variable capacitor and the variable inductor thereto, the third and fourth switches may be closed after the setting of the variable capacitor and the variable inductor, and thereafter the first and second switches may be open.

According to still another embodiment, a system for matching an impedance of a radio frequency (RF) load to an impedance of a RF source may comprise: a frequency detector for determining a frequency of a RF source; voltage, current and phase detectors for determining voltage, current and phase of a RF load; a RF attenuator having an input coupled to the RF source and an output coupled to the frequency, voltage, current and phase detectors; an impedance matching network coupled to the RF attenuator, frequency, voltage, current and phase detectors and to the RF load, wherein the impedance matching network may comprise a variable capacitor and a variable inductor; a measurement, calculation and control circuit coupled to the frequency, voltage, current and phase detectors, and the variable capacitor and the variable inductor; wherein from the frequency of the RF source and the voltage, current and phase of the RF load, the measurement, calculation and control circuit calculates capacitance and inductance values required for the variable capacitor and the variable inductor to match the impedance of the RF load to the RF source impedance, and then sets the variable capacitor and the variable inductor to the capacitance and inductance values, respectively; a first switch coupled in parallel with the impedance matching network; a second switch coupled in parallel with the RF attenuator and frequency, voltage, current and phase detectors; wherein the first switch may be closed during calculation of the capacitance and inductance values and setting of the variable capacitor and the variable inductor thereto, and open thereafter, and the second switch may be open when the first switch may be closed and closed when the first switch may be open.

According to a further embodiment, the impedance matching network may be configured as a low pass filter whereby the variable capacitor may be coupled at the RF source and the variable inductor may be coupled between the RF source and the RF load. According to a further embodiment, the impedance matching network may be configured as a high pass filter whereby the variable inductor may be coupled at the RF source and the variable capacitor may be coupled between the RF source and the RF load.

According to a further embodiment, the variable inductor may comprise a plurality of inductors having an inductance configured with a first plurality of switches that short out unused ones of the plurality of inductors, and the variable capacitor may comprise a plurality of capacitors having a capacitance configured with a second plurality of switches that disconnect unused ones of the plurality of capacitors. According to a further embodiment, the first and second plurality of switches may be a first and second plurality of relay contacts. According to a further embodiment, the RF source may be a RF transmitter and the RF load may be an antenna.

BRIEF DESCRIPTION OF THE DRAWINGS

A more complete understanding of the present disclosure may be acquired by referring to the following description taken in conjunction with the accompanying drawings wherein:

FIG. 13 illustrates: (a) vector diagram plots of measured voltage and current, and the resultant calculated impedance of the RF load, and (b) example equations to calculate load impedance and convert to equivalent resistance (R) and reactance (X) values, according to the teachings of this disclosure;

Figure 1:
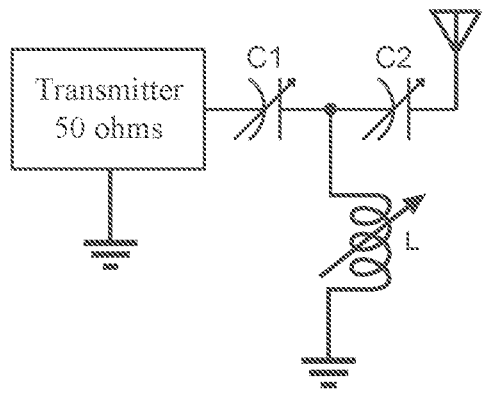
FIGS. 1-3 illustrate prior art schematic diagrams of antenna couplers.
Figure 2:
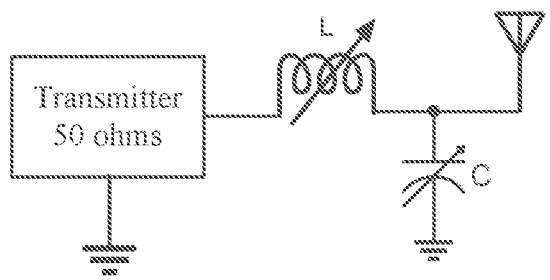
Figure 3:
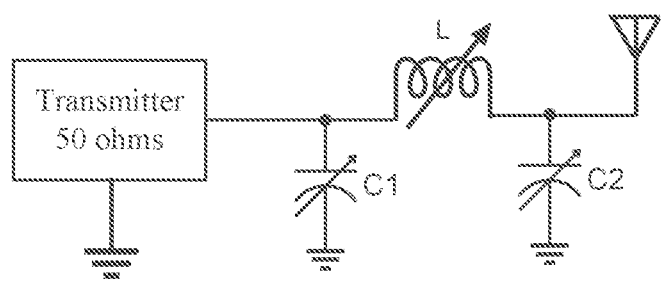

While the present disclosure is susceptible to various modifications and alternative forms, specific example embodiments thereof have been shown in the drawings and are herein described in detail. It should be understood, however, that the description herein of specific example embodiments is not intended to limit the disclosure to the forms disclosed herein.

DETAILED DESCRIPTION

The descriptions of specific example embodiments of the invention herein may refer to a transmitter as the RF source and an antenna as the RF load, and the impedance matching device between the RF source and RF load as an antenna matching network or "antenna coupler." Other types of RF sources such as for example, but not limitation, are RF power generators used for medical, industrial and military purposes such as nuclear magnetic resonance spectroscopy, diathermy, induction heating, radar, radio controlled drone deactivation, laser excitation, absorption heating, microwave ovens, and the like. RF loads may be in any form that accepts RF power from the RF source and converts the RF power into a useful physical property appropriate for the intended purpose. The RF source may be a frequency agile RF generator, and the RF load may present different complex impedances at various frequencies of use.

Switches referenced to and disclosed herein may be relay controlled switch contacts, rotary switch contacts, and/or solid-state switches such, for example but not limited to, PIN diodes, field effect transistors (FETs), monolithic analog switches and the like. "Reset" may refer to initiation of finding a match condition between a RF load and a RF source.

According to various embodiments, the antenna coupler input may be raised to an impedance higher than the RF load (antenna) to be matched. In order to use an L-match network, the load impedance must be lower than the source impedance. Otherwise, it must be first determined at which end of the inductor (source or load side) the capacitor needs to be connected. To avoid this complication, the antenna coupler operates at a higher input impedance than the output load impedance to be matched, for example but is not limited to, a 450-ohm input matching network. This has the additional benefit of making the inductor and capacitor values more feasible.

Raising the input impedance of the antenna coupler may be accomplished with a 1:N step-up impedance transformer e.g., Unun (unbalanced-to-unbalanced) or a Balun (balanced to unbalanced—reversed). Using such a transformer does not add a frequency dependent variable, so simple equations may be used for determining the values of inductance and capacitance, wherein the only variables are the load impedance (calculated from the load voltage, current and phase angle between the voltage and current) and frequency of operation. Wherein a 50-ohm transmitter output is stepped up by a factor of N, e.g., 1:4, 1:9, 1:12. N may also be a positive non-integer value and is contemplated herein. The Unun or Balun may be an air inductor or insulated wire wrapped around a ferrite core toroid. Either a current (choke) or voltage Unun/Balun. It is contemplated and within the scope of this disclosure that N may be a non-integer value, and that the step-up impedance transformer may be implemented with strip line technologies at microwave frequencies. At microwave frequencies the 1:N step-up impedance transformer may be fabricated using strip line technologies, for example, but not limited to, a printed circuit board, ceramic substrate or integrated circuit die.

By using an antenna coupler input impedance higher than the output impedance to be matched to will provide only one correct matching solution. It also may reduce component stress as there may be lower RF currents and voltages on the inductor (L) and capacitor (C) components. It may also provide faster tuning speed for matching during auto-mode match operation and may lower component losses and provide better efficiency. Automatic link establishment (ALE) operation may be easily accommodated with various embodiments of this disclosure by bypassing the antenna coupler and directly coupling the ALE radio to the antenna for receive channel scanning. Since match determination (frequency measurement, load impedance determination, and inductor and capacitor value selection) are so fast no match solution memories are required when going back to transmit and the antenna coupler is again between the transmitter and antenna.

Once the RF frequency of operation, and RF load voltage, current and phase are determined; simple calculations may be used to select inductance and capacitance values for the L-network to match the load impedance to the source impedance. As used herein "phase" refers to the phase angle between the voltage and current of the RF load. A microprocessor and firmware program may be used for the calculations and may also control relays or servo mechanisms for selecting the inductance and capacitance values. References to switch or relay contacts may be used interchangeably herein.

Referring now to the drawings, the details of example embodiments are schematically illustrated. Like elements in the drawings will be represented by like numbers, and similar elements will be represented by like numbers with a different lower-case letter suffix.

Figure 4A:
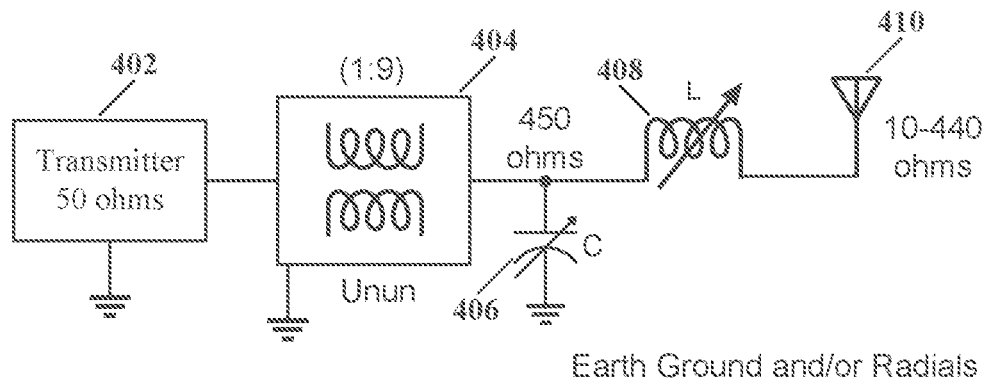
FIGS. 4A and 4B illustrate schematic diagrams of antenna couplers for use with an unbalanced antenna, according to specific example embodiments of this disclosure.
Figure 4B:
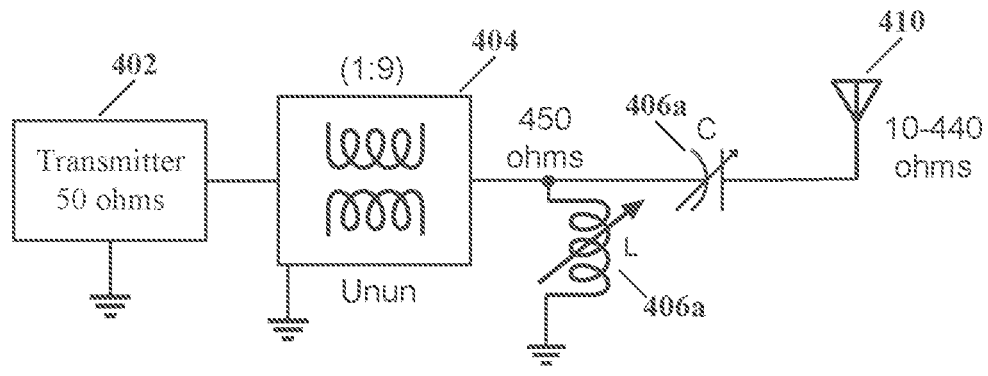

Referring to FIGS. 4A and 4B, depict schematic diagrams of antenna couplers for use with an unbalanced antenna, according to specific example embodiments of this disclosure. A RF source (transmitter) having a 50-ohm output impedance may be stepped up to 450 ohms with a 1:9 impedance step-up transformer 404 (unbalanced-to-unbalanced transformer—Unun). It is contemplated and within the scope of this disclosure that other impedance step-up ratios may be utilized and the 1:9 ratio is used herein for exemplary purposes. This stepped-up impedance (450 ohms) is used as the input impedance of a matching network comprising variable capacitor 406 and variable inductor 408. By using a higher input impedance for the matching network, load impedances of from about 10 ohms to about 440 ohms may be matched using only one set of inductor (L) and capacitor (C) values for a corresponding frequency of operation and load impedance. FIG. 4A illustrated a low pass filter configuration for the matching network, and FIG. 4B illustrated a high pass filter configuration for the matching network. High pass and low pass filter configurations may be interchangeably used for all the specific example embodiments of antenna couplers disclosed herein.

Figure 5:
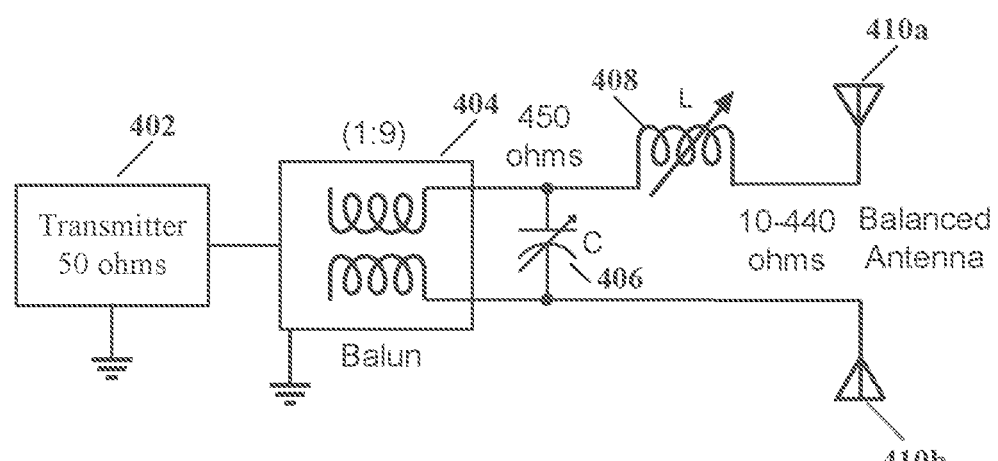
FIG. 5 illustrates a schematic diagram of an antenna coupler for use with a balanced antenna, according to specific example embodiments of this disclosure.

FIG. 5 illustrates a schematic diagram of an antenna coupler for use with a balanced antenna, according to specific example embodiments of this disclosure. The impedance matching circuit shown in FIG. 5 operates in substantially the same way as the matching circuit of FIG. 4 with the difference that an unbalanced-to-balanced step-up transformer (unbalanced-to-balanced—Balun) may be used to "float" the node of the capacitor 406 not coupled to the inductor 408 and then the other half of the balanced antenna 410b may be coupled thereto. The circuit shown in FIG. 4 may also be used for a balanced load by placing a Balun (not shown) between the unbalanced output of the (load side of inductor 408) and the balanced load (antenna) 410a, 410b; however, with the Balun placed at the input of the matching network, the Balun is in a controlled impedance node as opposed to the widely variable impedances of the output load.

The impedance matching circuits shown in FIGS. 4 and 5 may comprise a continuously variable inductor 408, e.g., roller inductor, or switched fix value inductors using switching relays (not shown) or manually operated switch contacts (not shown). Similarly, the capacitor 406 may be continuously variable, e.g., air variable, vacuum variable; or switched fix value capacitors using switching relays (not shown) or manually operated switch contacts (not shown).

The impedance matching circuits shown in FIGS. 4A, 4B and 5 may be configured in an enclosure having adjustment knobs and/or switches that may be manually adjusted by a radio operator using a VSWR or reflected power meter. The RF source (transmitter) 402 may be used to provide RF power for adjustment of the inductor 408 and capacitor 406, or an antenna analyzer may be used to supply a frequency and determine when the input to the 1:N step-up impedance transformer is 50 ohms. The inductor 408 and capacitor 406 may also be adjusted by the radio operator by listening to noise or signal strength increase on a radio receiver. The radio operator may adjust the inductor 408 and capacitor 406 for maximum RF power output to the RF load (antenna) 410 by using an in-line RF power meter such as a Bird watt meter. Since there is only one combination of inductor 408 and capacitor 406 settings the radio operator may easily and quickly adjust the impedance matching circuits shown in FIGS. 4A, 4B and 5 for proper impedance matching of the RF load (antenna) 410 to the RF source (transmitter) 402.

The impedance step-up transformer 404, variable capacitor 406 and variable inductor 408 may be built into and be part of a radio transceiver (transmitter and receiver combined). Adjustment of the inductor 408 and capacitor 406 may be performed either manually or automatically.

The impedance matching circuits shown in FIGS. 4A, 4B and 5 may also be configured in a weatherproof enclosure located at or near the RF load (antenna) 410 and the radio operator may remotely control the adjustments for the inductor 408 and capacitor 406. These adjustments may be performed manually as described above or automatically as more fully described hereinafter.

Figure 10:
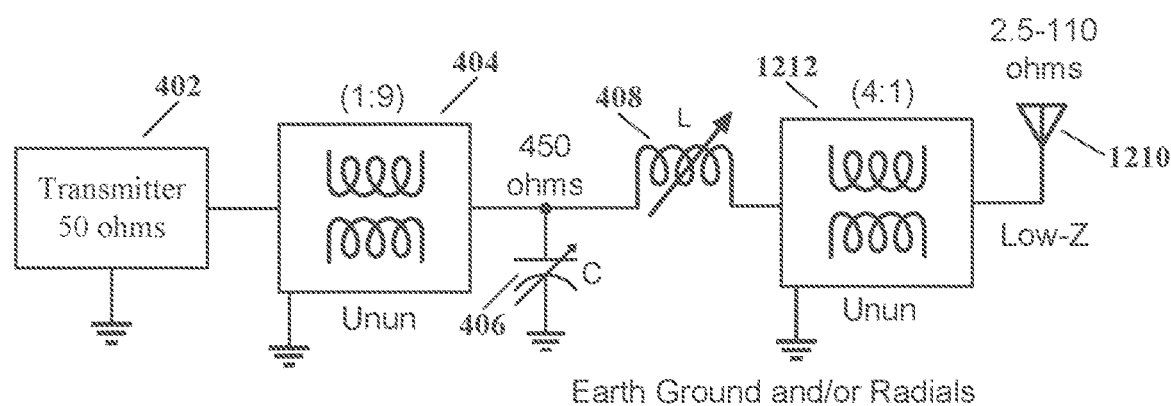
FIG. 10 illustrates a schematic diagram of the antenna coupler shown in FIG. 4 with a four-to-one (4:1) broadband RF transformer between the antenna coupler output and antenna (RF load), according to specific example embodiments of this disclosure.

Referring to FIG. 10, depicted is a schematic diagram of the antenna coupler shown in FIG. 4 with a four-to-one (4:1) broadband RF transformer between the antenna coupler output and antenna (RF load), according to specific example embodiments of this disclosure. A four (4) to one (1) (4:1) impedance step-down transformer 1212 may be coupled between the output end of the inductor 408 and the RF load 1210 to provide a match range of from about 2.5 ohms to about 110 ohms. This step-down transformer 1212 may be switched in and out of the RF path with switches or relays (not shown) controlled by the calculation and selection control circuit 632 (see FIG. 6). The step-down transformer 1212 may also be optionally provided on an as needed basis (internally or externally installed) when the RF load (antenna) 1210 is mainly low impedance at the frequencies of operation. It is contemplated and within the scope of this disclosure that the step-down transformer 1212 may have other step-down impedance ratios, e.g., 2:1, 1.56:1, 1.5:1. The step-down impedance ratios are only limited by the current handling capabilities of the transformer materials. A pair of impedance step-down transformers 1212 or a reverse Balun (unbalanced to balanced transformer) may be used with the impedance matching circuit shown in FIG. 5.

Figure 11:
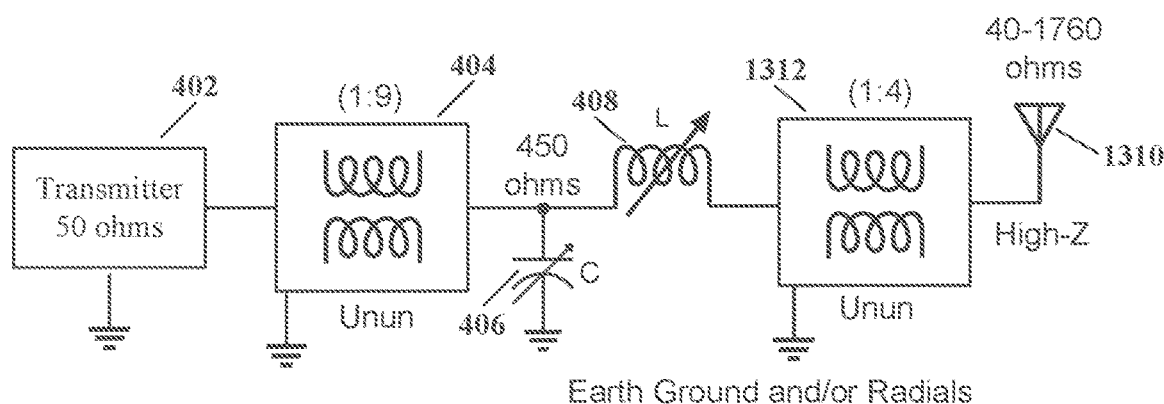
FIG. 11 illustrates a schematic diagram of the antenna coupler shown in FIG. 4 with a one-to-four (1:4) broadband RF transformer between the antenna coupler output and antenna (RF load), according to specific example embodiments of this disclosure.

Referring to FIG. 11, depicted is a schematic diagram of the antenna coupler shown in FIG. 4 with a one-to-four (1:4) broadband RF transformer between the antenna coupler output and antenna (RF load), according to specific example embodiments of this disclosure. A one (1) to four (4) impedance (1:4) step-up transformer 1312 may be coupled between the output end of the inductor 408 and the RF load 1210 to provide a match range of from about 40 ohms to about 1760 ohms. This step-up transformer 1312 may be switched in and out of the RF path with switches or relays (not shown) controlled by the calculation and selection control circuit 632 (see FIG. 6). The step-up transformer 1312 may also be optionally provided on an as needed basis (internally or externally installed) when the RF load (antenna) 1310 is mainly high impedance at the frequencies of operation. It is contemplated and within the scope of this disclosure that the step-up transformer 1312 may have other step-up impedance ratios, e.g., 1:2, 1:1.56, 1:1.5. The step-up impedance ratios are only limited by the voltage handling capabilities of the step-up transformer materials. A pair of impedance step-up transformers 1312 or a reverse Balun (unbalanced to balanced transformer) may be used with the impedance matching circuit shown in FIG. 5.

Figure 6A:
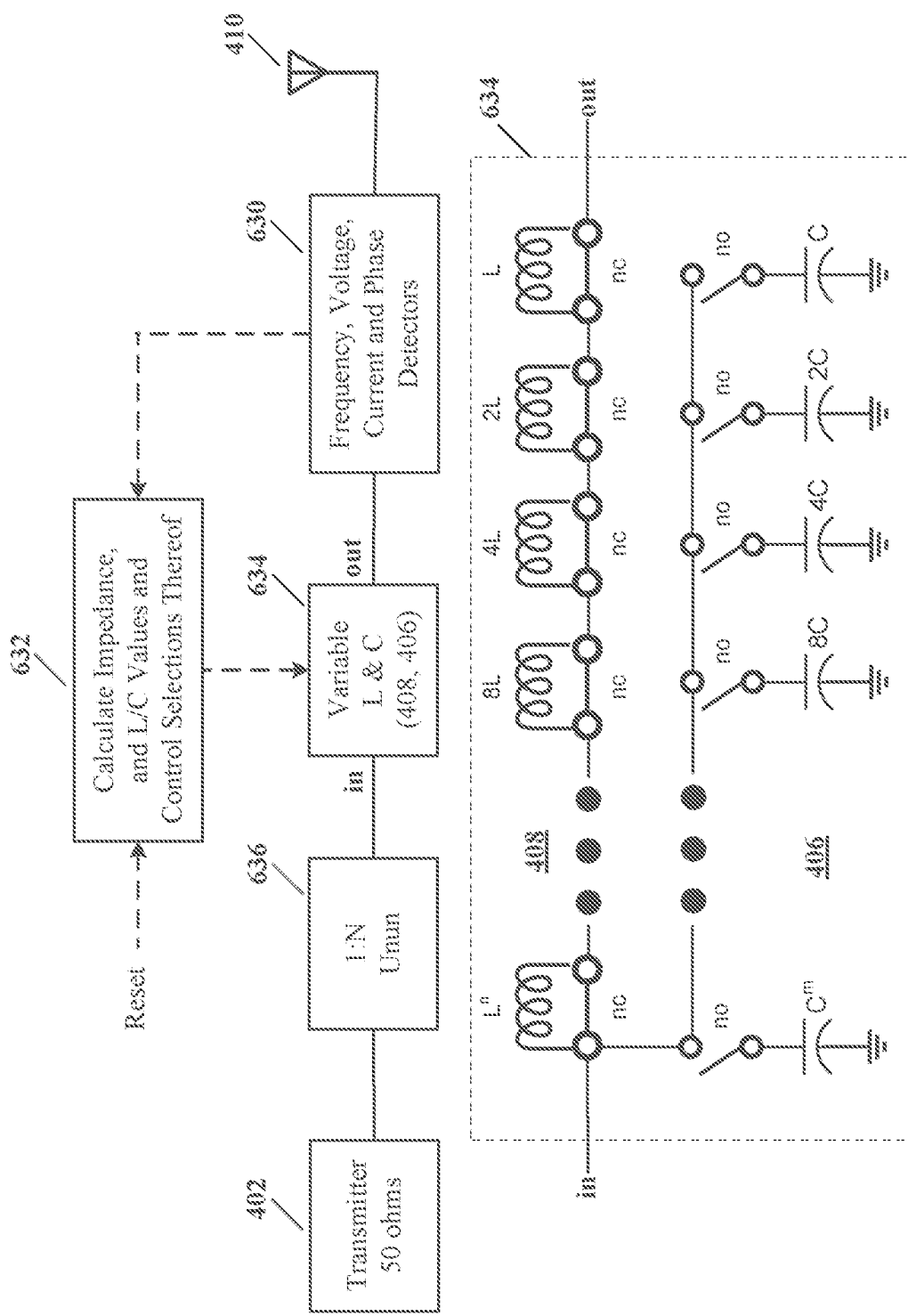
FIGS. 6A-6D illustrate schematic block diagrams of automatic operation antenna couplers, according to specific example embodiments of this disclosure.

Referring to FIG. 6A, depicted is a schematic block diagram of an automatic operation antenna coupler, according to specific example embodiments of this disclosure. The antenna coupler shown in FIG. 6A may comprise a 1:N step-up impedance transformer 636, a matching network 634 comprising configurable values of inductance 408 and capacitance 406, frequency, voltage, current and phase detectors 630, and a calculation and selection control circuit 632.

The output of the (RF source) transmitter 402 may be coupled to the 1:N step-up impedance transformer 636. The matching network 634 may be coupled between the 1:N step-up impedance transformer and the frequency, voltage, current and phase detectors 630. The calculation and selection control circuit 632 may have inputs coupled from the frequency, voltage, current and phase detectors 630 and have outputs coupled to the matching network 634 for controlling selection of inductance and capacitance values of the inductor 408 and capacitor 406 therein. The RF load (antenna) 410 may be coupled to the matching network 634 through the frequency, voltage, current and phase detectors 630.

Figure 14:
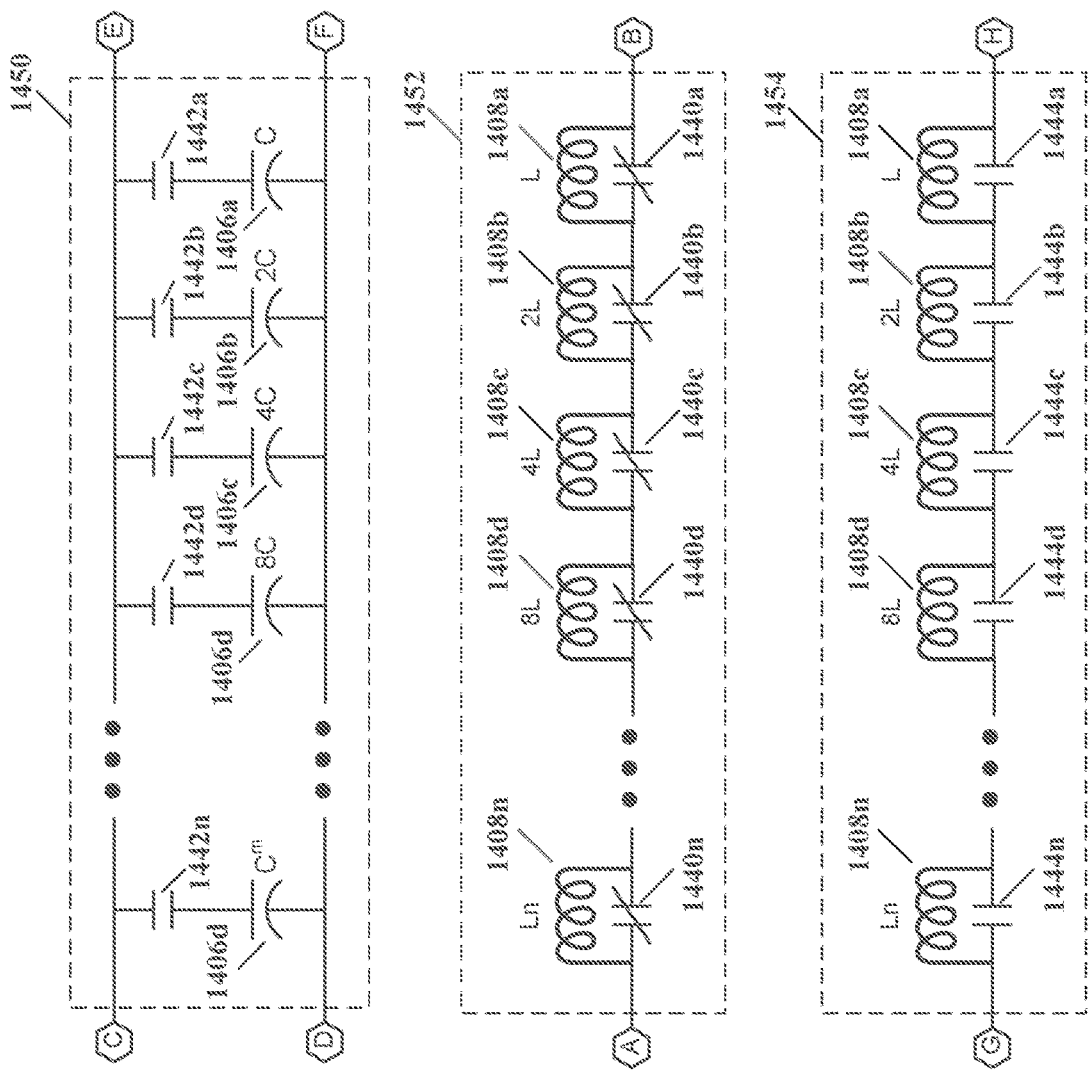
FIG. 14 illustrates schematic diagrams of a plurality of capacitors, inductors and relays configured to provide variable capacitance and inductance values, according to specific example embodiments of this disclosure.

The calculation and control circuit 632 may comprise a microcontroller having analog-to-digital converters (ADCs) for receiving and converting information from the detectors 630, a frequency counter for determining the signal frequency of the RF source, and outputs for controlling adjustment of the variable inductor 408 and variable capacitor 406 of the matching network 634 (see FIG. 14). A reset signal to the calculation and control circuit 632 may be used to start a new match determination operation once RF power is detected as more fully described hereinafter. The reset may also be used to put the matching network 634 into a "bypass mode" wherein there are no tuned circuits during receiver channel scanning for automatic link establishment (ALE) operation. Wherein the matching network 634 will reactivate connection of the inductor 408 and capacitor 406 when RF power is again applied to the matching network 634.

A more detailed schematic circuit diagram depicts a plurality of inductors 408 and a plurality of capacitors 406 configured as a low pass filter L-network. Each switch (relay) contact associated with the plurality of inductors 408 is normally closed, and each switch (relay) contact associated with the plurality of capacitors 406 is normally open. Thus, when the switches (relays) are not activated (powered) the plurality of inductors are shorted out of the signal path, and the plurality of capacitors are disconnected therefrom. For a matching operation the plurality of inductors and capacitator values may be binary weighted for efficiency in selecting various value combinations thereof. A high pass filter configuration for the matching network 634 may be similarly configured as shown in FIG. 4B.

Figure 6B:
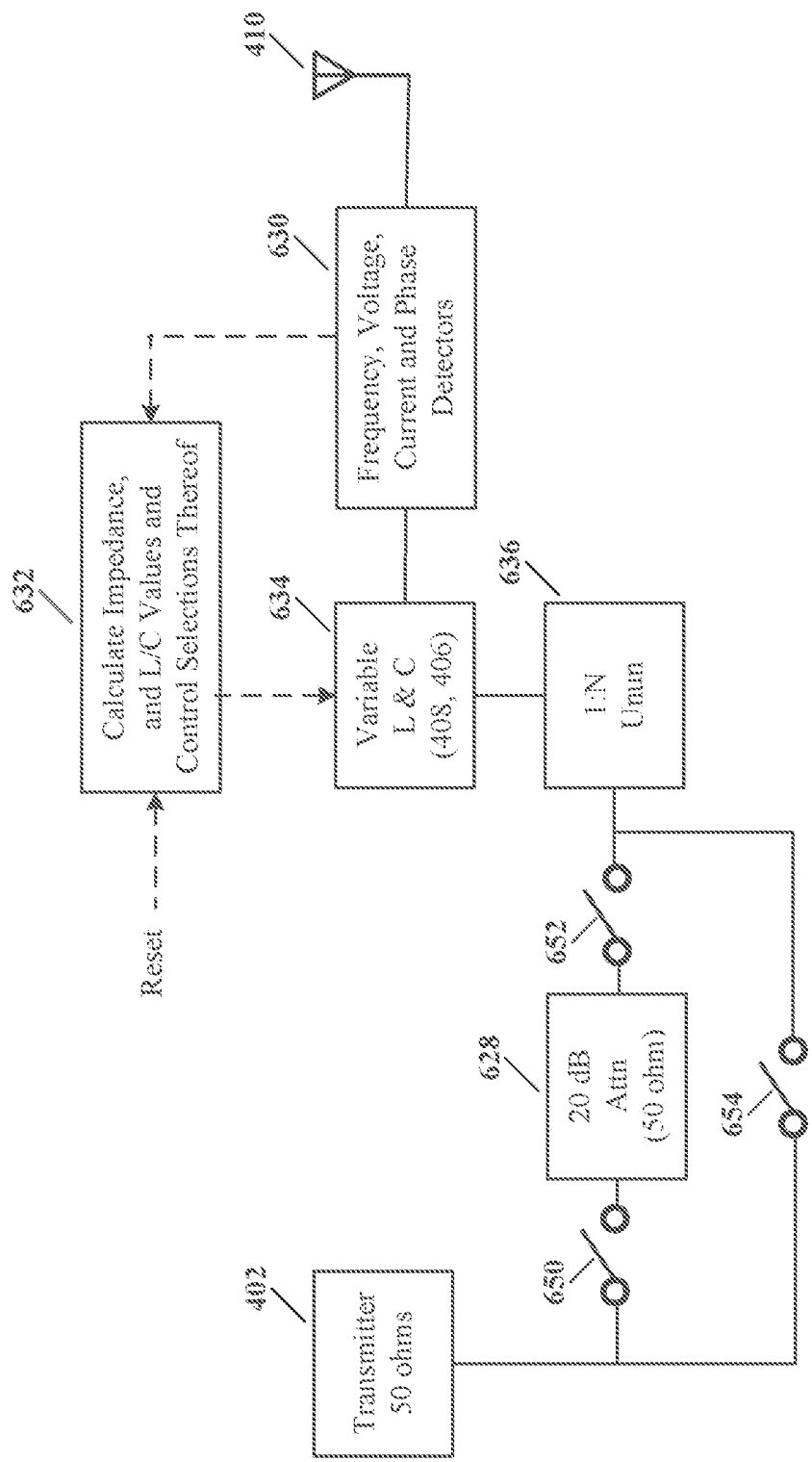

Referring to FIG. 6B, depicted is a schematic block diagram of an automatic operation antenna coupler, according to specific example embodiments of this disclosure. The antenna coupler shown in FIG. 6B is substantially similar in configuration and operation as the antenna coupler of FIG. 6A, and further comprises a RF attenuator 628 and associated switches 650, 652 and 654. The attenuator 628 may be coupled between the transmitter (RF source) 402 and the 1:N step-up impedance transformer 636. The RF attenuator 628 may provide a more uniform impedance load to the transmitter 402 and reduce RF power during configuring the inductors 408 and capacitors 406 for a match. Once the inductors 408 and capacitors 406 have been configured, the RF attenuator 628 may be removed from the RF power path between the transmitter 402 and the antenna 410.

Figure 6C:
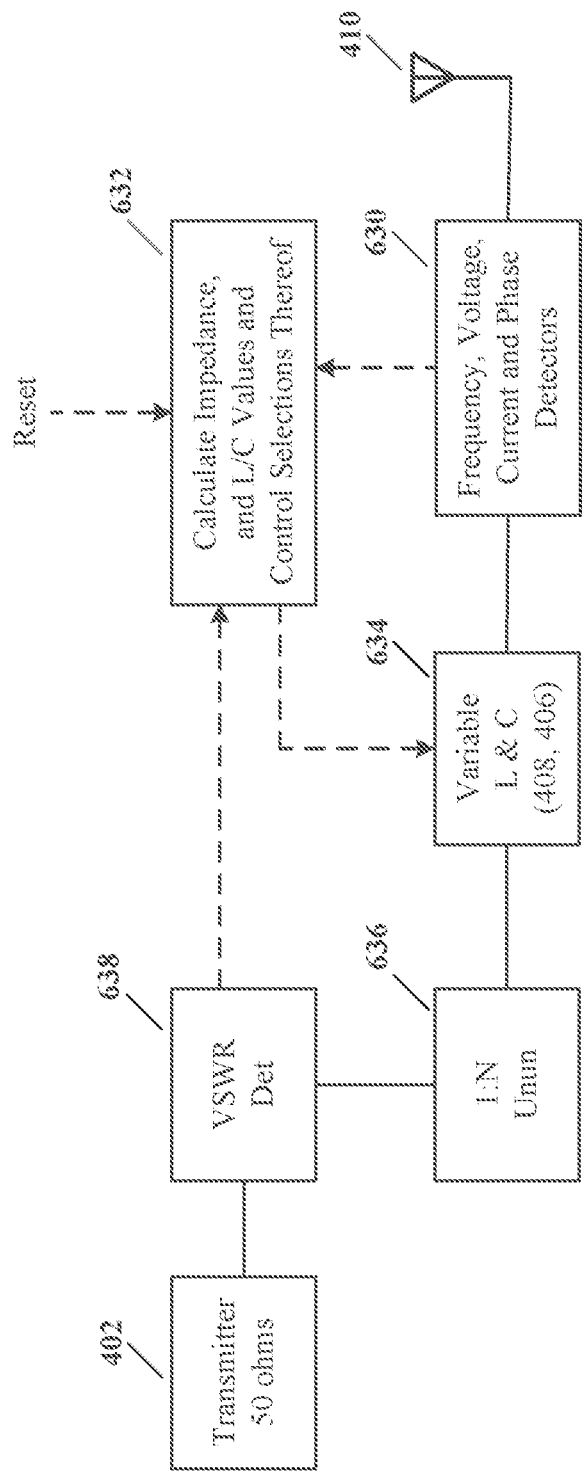

Referring to FIG. 6C, depicted is a schematic block diagram of an automatic operation antenna coupler, according to specific example embodiments of this disclosure. The antenna coupler shown in FIG. 6C is substantially similar in configuration and operation as the antenna coupler of FIG. 6A, and further comprises a voltage standing wave (VSWR) detector 638 coupled between the transmitter 402 and the impedance set-up transformer 636. The VSWR detector 638 may be used to monitor proper operation of the matching network 634, and if a high VSWR is detected then alarm and/or take some action like telling the calculation and control circuit 632 to initiate a new match operation.

Figure 6D:
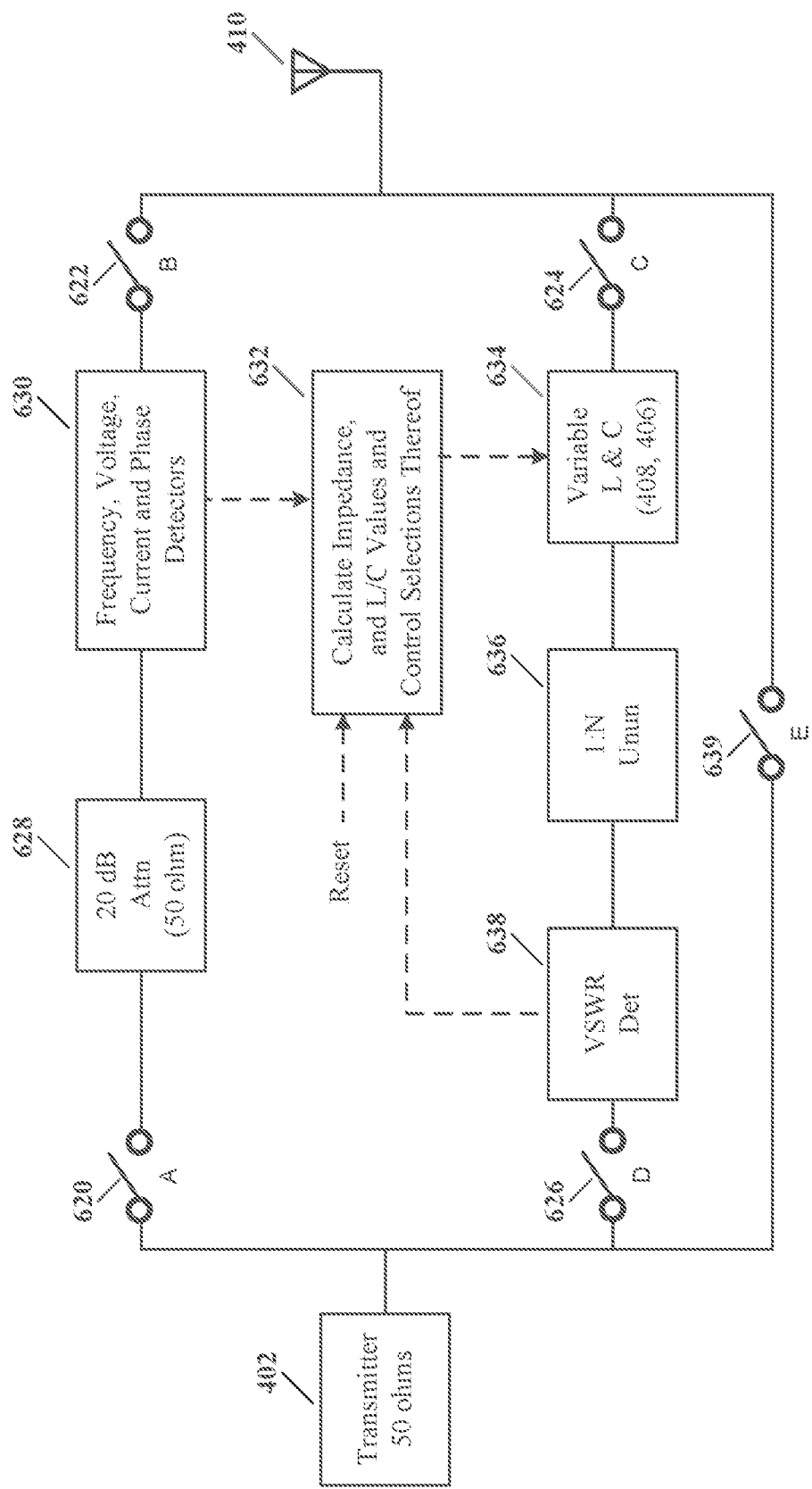

Referring to FIG. 6D, depicted is a schematic block diagram of an automatic operation antenna coupler, according to specific example embodiments of this disclosure. The automatic operation antenna coupler shown in FIG. 6D may comprise a plurality of relays 620-626, a RF attenuator 628, frequency, voltage, current and phase detectors (sensors) 630, an inductor (L) and capacitor (C) value calculation and selection control circuit 632, an L/C matching network 634 comprising configurable values of inductance 408 and capacitance 406, a 1:N step-up impedance transformer 636, and a voltage standing wave ratio (VSWR) detector 638. The output of the (RF source) transmitter 402 may be coupled to the attenuator 628 through switch 620. The output of the attenuator 628 may be coupled to an input of the frequency, voltage, current and phase detectors 630; and the output thereof to the RF load (antenna) 410 through switch 622. Switches 624 and 626 couple the matching network 634, 1:N step-up impedance transformer 636 and a voltage standing wave ratio (VSWR) detector 638 between the transmitter 402 and load 410, as more fully described hereinafter. The calculation and control circuit 632 may comprise a microcontroller having analog-to-digital converters (ADCs) for the receiving and converting information from the detectors (sensors) 630 and VSWR detector 638, counters for determining the frequency of the RF signal, and outputs for controlling adjustment of the variable inductor and capacitor (see FIG. 12).

Figure 7:
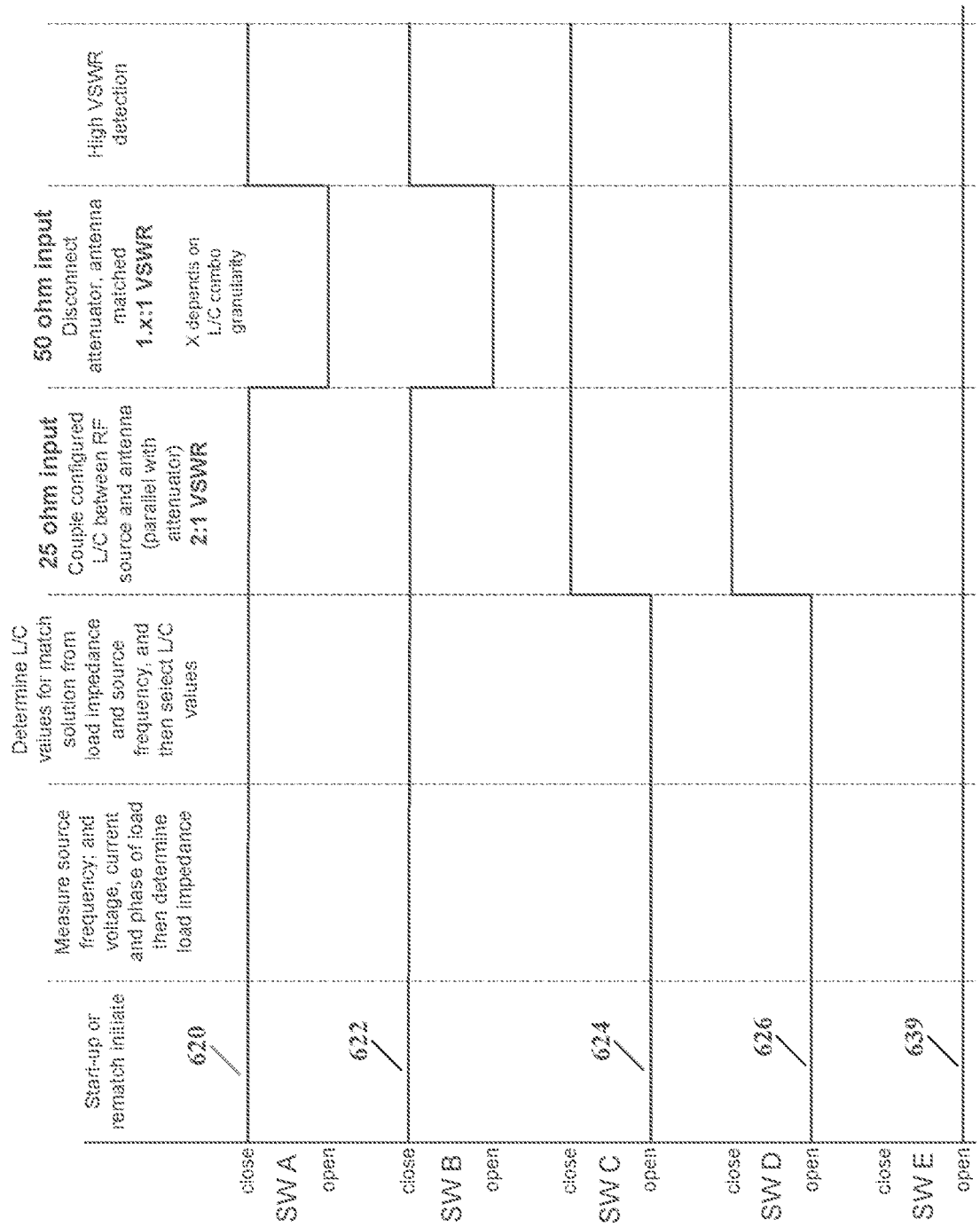
FIG. 7 illustrates a schematic timing diagram of the automatic antenna coupler shown in FIG. 6D, according to specific example embodiments of this disclosure.

Referring to FIG. 7, depicted is a schematic timing diagram of the automatic antenna coupler shown in FIG. 6D, according to specific example embodiments of this disclosure. When switches 620 and 622 are closed the frequency, voltage, current and phase detectors 630 use an attenuated sample from the attenuator 628 of RF power coupled to the (RF load) antenna 410, and thereby measure the voltage, current and phase of the antenna 410 at the frequency of the RF power supplied by the transmitter 402 to the antenna 410. Once the frequency, voltage, current and phase angle between the voltage and current at the antenna 410 have been measured; the inductor 408 and capacitor 406 values may be determined for a match solution.

The calculation and selection control circuit 632 may determine the inductance and capacitance values required for an impedance match condition between the RF source 402 and RF load 410, then may control selection of the appropriate inductance and capacitance values of the matching network 634. During the frequency, voltage, current and phase detection; and inductance and capacitance value selection the relays 624 and 626 are open, whereby no RF power is applied to the matching network 634. This feature greatly improves component reliability and longevity (relay or switch contacts may switch under no, or limited, voltage and current conditions).

Only after the selection of the inductance and capacitance values have been made will the switches 624 and 626 close, and then are subject to only about one-half RF power since the 50 ohm attenuator 628 is still coupled between the RF power source 402 and the (RF load) antenna 410 and in parallel with the matching network 634. An advantage of the aforementioned method of operation is that the RF power source 402 will not see a VSWR of greater than about 2:1 (50-ohm attenuator load in parallel with the now 50-ohm impedance configured L-C network 634 coupled between the transmitter 402 and antenna 410). Once the switches 624 and 626 have closed, switches 620 and 622 can open and the RF power source 402 then sees the RF load 410 as substantially 50 ohms.

The VSWR detector 638 may continuously monitor VSWR of the RF load 410 and if the load VSWR increases above a certain value then the switches 620 and 622 will close again and thereafter the switches 624 and 626 will open. This will provide an automatic rematch initiate and the aforementioned switching sequences, load impedance determination, and L-C selections will be done again.

Bypass switch 639 may be used for automatic link establishment (ALE) operation, wherein the switch 639 bypasses the antenna coupler (switches 620-626 open) and directly couples the RF source 402 (ALE radio transceiver in this case) to the antenna 410 (switch 639 closed) for ALE receive channel scanning. Since match determination (impedance and frequency measurement and inductor and capacitor values selection) is so fast that no match solution memories are required when going back to transmit if a new match solution is required at a different transmit frequency or load impedance, and the antenna coupler is again between the transmitter 402 and antenna 410.

Figure 8A:
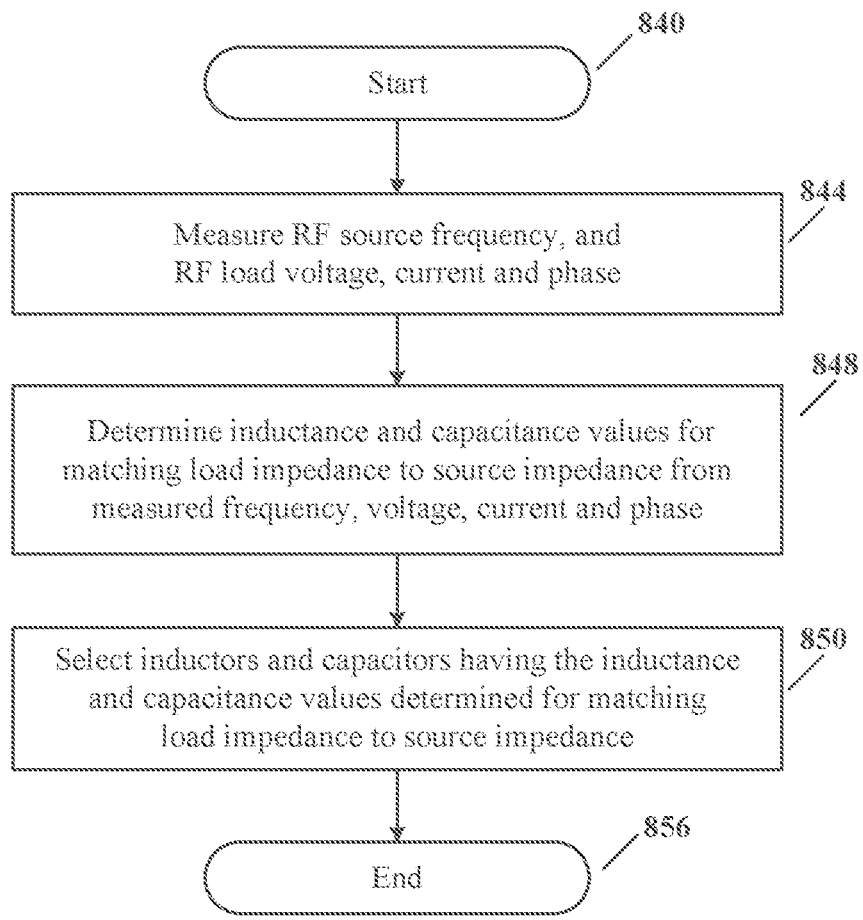
FIGS. 8A, 8B and 8C illustrate schematic operational flow diagrams of the automatic antenna couplers shown in FIGS. 6A, 16A, 6B, 16B, 6D and 16D, respectively, according to specific example embodiments of this disclosure.

Referring to FIG. 8A, depicted is a schematic operational flow diagram of the automatic operation antenna coupler shown in FIG. 6A, according to specific example embodiments of this disclosure. Since the input to the matching network 634 will be at a higher impedance than the impedance of the RF load 410, there will be only one combination of inductance and capacitance values to produce a match. Step 840 starts the match sequence. In step 844 the RF source frequency, and RF load voltage, current and phase are measured. In step 848 the inductor and capacitor values for the matching network 634 are determined (calculated) from the measured RF source frequency, and RF load voltage, current and phase. In step 850 the values for the inductor 408 and the capacitor 406 are selected to provide a match between the RF source 402 and RF load 410. Step 856 ends the match sequence.

Figure 8B:
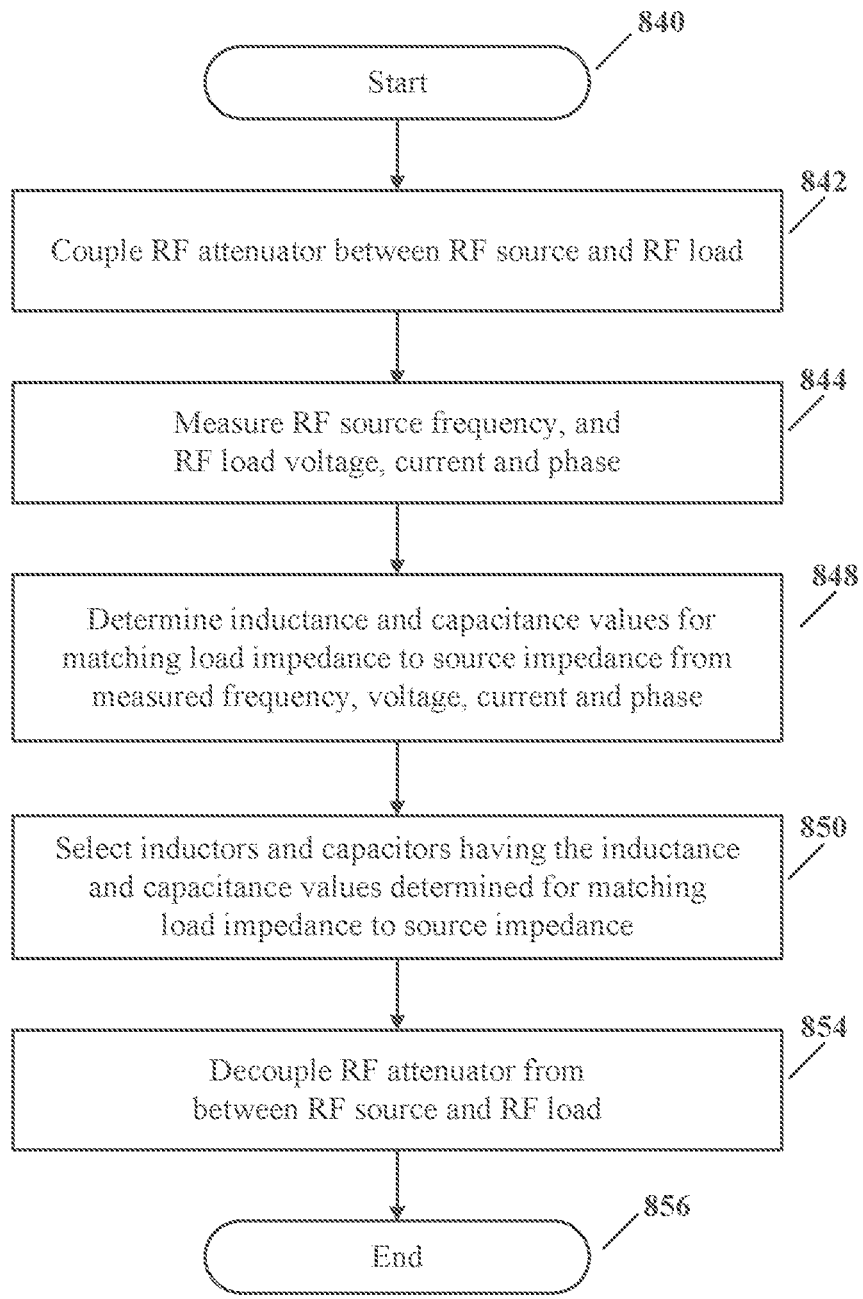

Referring to FIG. 8B, depicted is a schematic operational flow diagram of the automatic operation antenna coupler shown in FIG. 6B, according to specific example embodiments of this disclosure. Since the input to the matching network 634 will be at a higher impedance than the impedance of the RF load 410, there will be only one combination of inductance and capacitance values to produce a match. Step 840 starts the match sequence. In step 842 the RF attenuator 628 is coupled between the transmitter 402 and the 1:N step-up impedance transformer 636 with switches 650 and 652 closed and switch 654 open. In step 844 the RF source frequency, and RF load voltage, current and phase are measured. In step 848 the inductor and capacitor values for the L-C network 634 are determined (calculated) from the measured RF source frequency, and RF load voltage, current and phase. In step 850 the values for the inductor 408 and the capacitor 406 are selected to provide a match between the RF source 402 and RF load 410. In step 854 the RF attenuator 628 is decoupled from the transmitter 402 and the 1:N step-up impedance transformer 636 when switches 650 and 652 open and switch 654 closes.

Step 856 ends the match sequence.

Figure 8C:
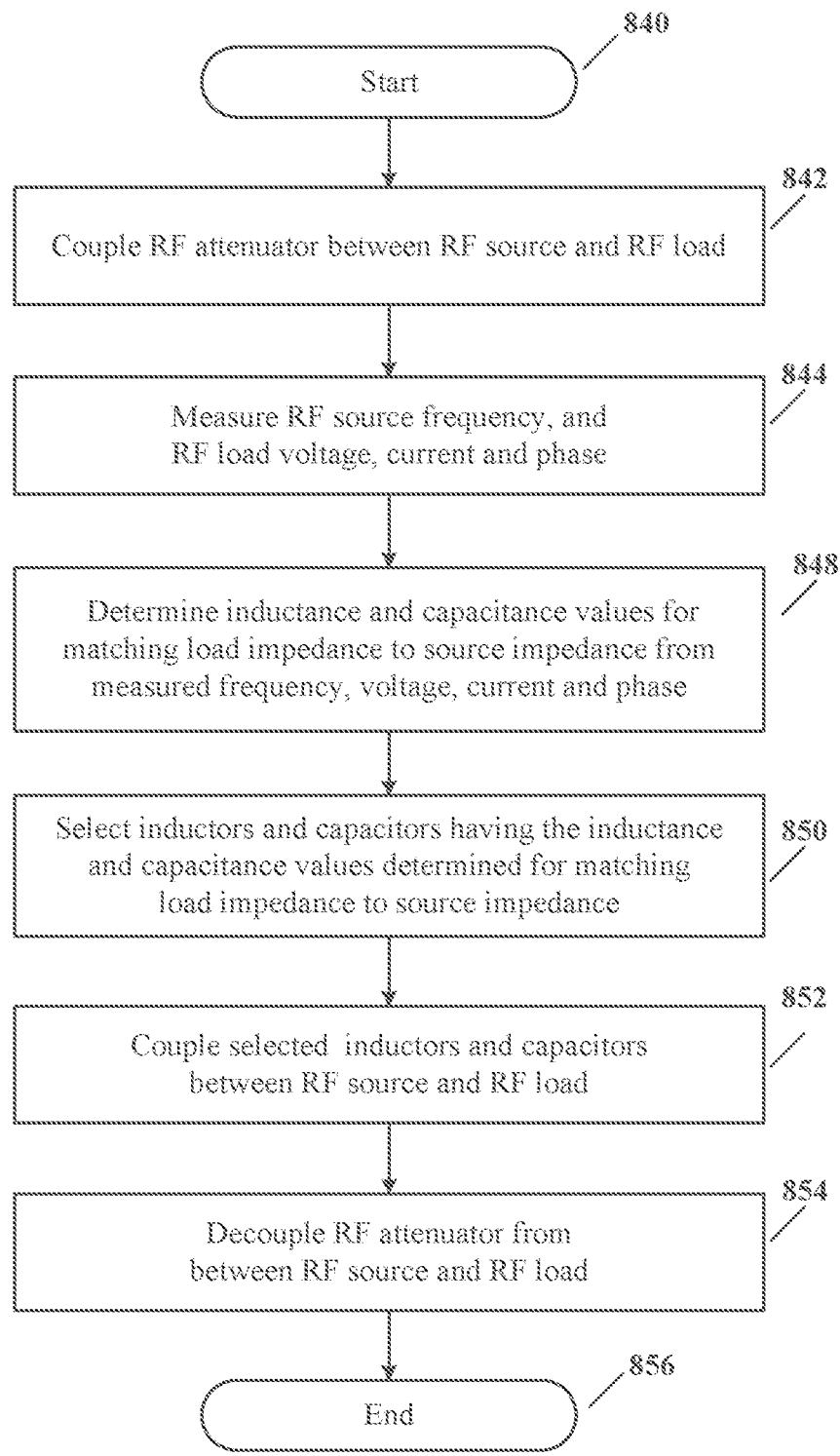

Referring to FIG. 8C, depicted is a schematic operational flow diagram of the automatic operation antenna coupler shown in FIG. 6D, according to specific example embodiments of this disclosure. Since the input to the L-C network 634 will be at a higher impedance than the impedance of the RF load 410, there will be only one combination of inductance and capacitance values to produce a match. Step 840 starts the match sequence. In step 842 the RF attenuator 628 and the frequency, voltage, current and phase detectors 630 are coupled between the RF source 402 and RF load 410. In step 844 the RF source frequency, and RF load voltage, current and phase are measured. In step 848 the inductor and capacitor values for the L-C network 634 are determined (calculated) from the measured RF source frequency, and RF load voltage, current and phase. In step 850 the values for the inductor 408 and the capacitor 406 are selected to provide a match between the RF source 402 and RF load 410. In step 852 the selected inductor(s) 408 and capacitor(s) are coupled between the RF source 402 and RF load 410. In step 854 the RF attenuator 628, and frequency, voltage, current and phase detectors 630 are decoupled from the RF source 402 and RF load 410. Step 856 ends the match sequence.

The required inductance and capacitance values may be determined once the RF source frequency and RF load voltage, current and phase are known. Then appropriate values for of inductance and capacitance may be selected without having to apply RF power during selection thereof. There is no iterative tuning required of the matching circuit 634. All inductor/capacitor selection relay and/or switch contacts may be opened and closed without the possibility of contact arcing and damage therefrom since no, or very little, RF power may be present during any change to the inductance and capacitance values.

Figure 12:
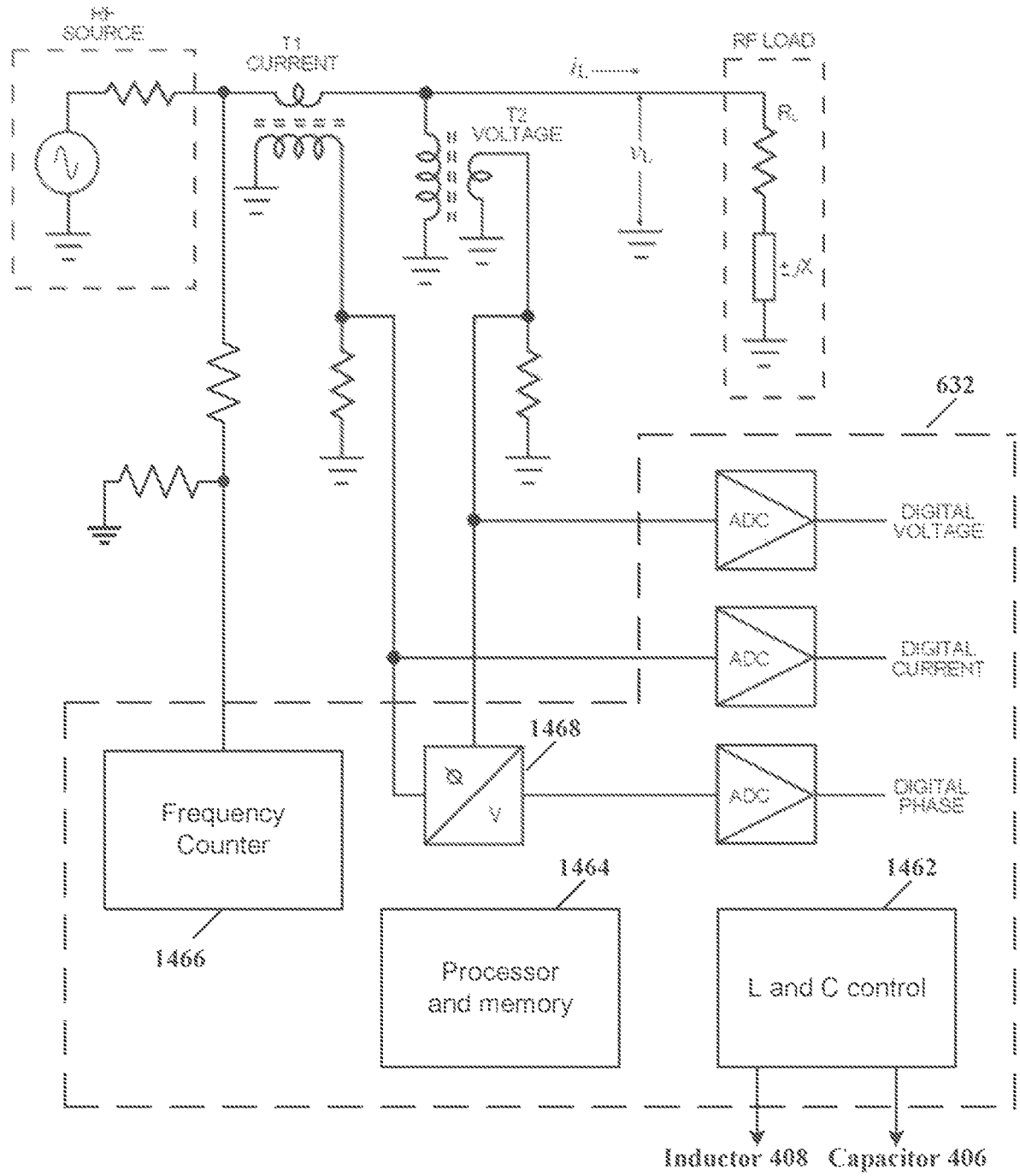
FIG. 12 illustrates a schematic circuit diagram for measuring and processing RF source frequency, RF load voltage, current and phase; and control of the inductor(s) and capacitor(s) for matching the RF load to the RF source, according to specific example embodiments of this disclosure.

Referring to FIG. 12, depicted is a schematic circuit diagram for measuring and processing RF source frequency, RF load voltage, current and phase; and control of the inductor(s) and capacitor(s) for matching the RF load to the RF source, according to specific example embodiments of this disclosure, according to specific example embodiments of this disclosure. A current transformer T1 may be used to measure RF load current. A voltage transformer T2 may be used to measure RF load voltage, and the phase angle between the measured voltage and current may be obtained from a phase-to-voltage converter 1468. The phase-to-voltage converter 1468 may provide a DC voltage having an amplitude proportional to the phase angle difference between the load voltage and load current. The phase-to-voltage converter 1468 output voltage may be configured so that when the load voltage leads the load current (inductive reactance) the converter 1468 output voltage is positive and when the load voltage lags the load current (capacitive reactance) the converter 1468 output voltage is negative or visa-versa.

A microcontroller may be used for the calculation and selection control circuit 632 and may provide all necessary signal processing modules such as analog-to-digital converters (ADC), phase-to-voltage converter 1468, frequency counter 1466, digital outputs to control selection of the capacitors 406 and inductors 408, and a digital processor and memory 1464.

Referring to FIG. 13, depicted are: (a) vector diagram plots of measured voltage and current, and the resultant calculated impedance of the RF load, and (b) example equations to calculate load impedance and convert to equivalent resistance (R) and reactance (X) values, according to the teachings of this disclosure. FIG. 13(*a*) depicts vector plots representing load voltage $V_L$, $V_R$ and $V_X$, and load resistance (R), reactance (jX) and impedance ($Z_L$). FIG. 13(*b*) shows the equations for finding load resistance (R), reactance (jX) and impedance ($Z_L$).

Figure 9:
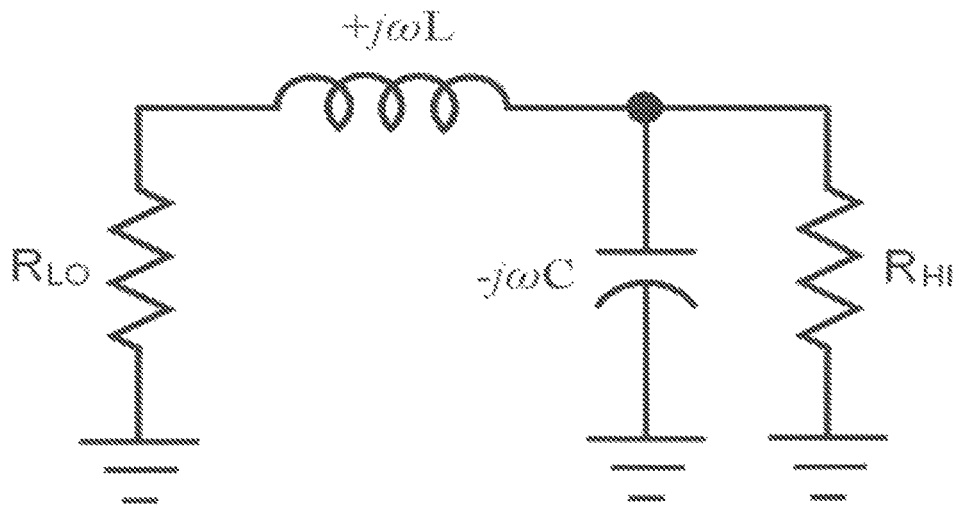
FIG. 9 illustrates a schematic diagram for transforming a low impedance to a high impedance using an inductor and capacitor, and equations for deriving the inductor and capacitor values.

Referring to FIG. 9, depicted is a schematic diagram for transforming a low impedance to a high impedance using an inductor and capacitor, and equations for deriving the inductor and capacitor values. Using the equations of FIG. 13, the resistive and reactive values of the load may be calculated, then the L-Match equations shown in FIG. 9 may be used to determine the proper values of capacitance and inductance to provide a match. The last step is to add or subtract the reactive part of load 410 to the value of inductance required. In the example shown, the load has 10-ohm inductive reactance. This will then be subtracted from the match inductance to provide an overall inductance required to match the resistive part of the load 410.

Referring to FIG. 14, depicted are schematic diagrams of a plurality of capacitors, inductors and relays configured to provide variable capacitance and inductance values, according to specific example embodiments of this disclosure. A variable inductor 1452 may comprise a plurality of inductors 1408*a*-1408*n* configured in series with respective normally closed relay contacts 1440*a*-1440*n* connected in parallel with each associated inductor 1408. When all the relay contacts 1440 are closed the inductors 1408 are shorted-out whereby node A is directly connected to node B. Only when one or more of the relay contacts 1140 are open will there be an inductance value between nodes A and B.

A variable inductor 1454 may comprise a plurality of inductors 1408*a*-1408*n* configured in series with respective normally open relay contacts 1444*a*-1444*n* connected in parallel with each associated inductor 1408. When each one of the plurality of relay contacts 1444 are open the inductors 1408 are in series whereby the inductors present a high inductive impedance between node G and node H. This is particularly advantageous when node G and node H are directly connected during a match operation more fully described hereinafter. Very little RF current will flow through the inductors 1408 when nodes G and H are directly connected during operational selection for closing the required ones of the plurality of relay contacts 1444. During an inductive match those inductors 1408 not required for the desired match inductance will be shorted out by closing the associated relay contacts 1444.

A variable capacitor 1450 may comprise a plurality of capacitors 1406 configured in parallel with respective relay contacts 1442*a*-1442*n* connected in series with each associated capacitor 1406. When all the relay contacts 1442 are open the plurality of capacitors 1406 are removed from nodes C/E whereby there is substantially no capacitance coupled between nodes C/E and D/F. Only when one or more of the relay contacts 1142 close will there be a capacitance value between nodes C/E and D/F.

Figure 15A:
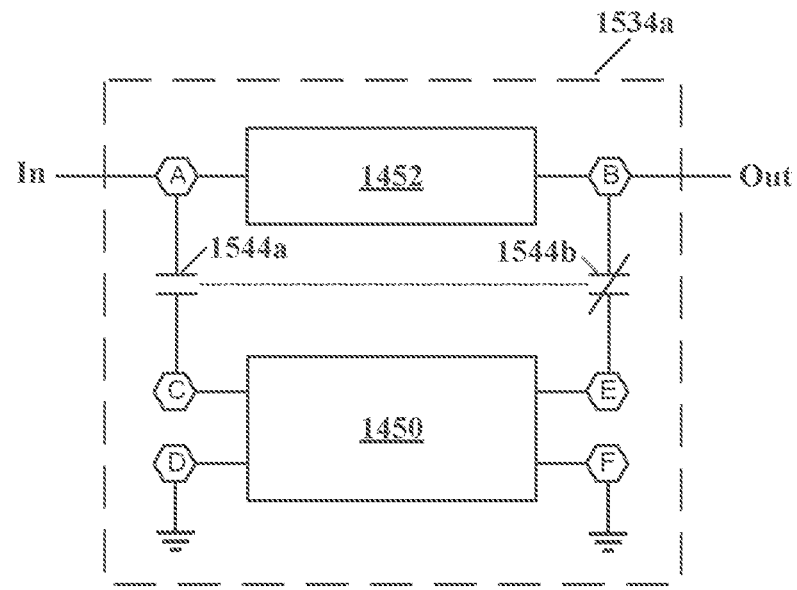
FIGS. 15A, 15B, 15C, 15D, 18A and 18B illustrate schematic diagrams of the plurality of capacitors and inductors shown in FIG. 14 configured as low pass and high pass matching networks, according to specific example embodiments of this disclosure.
Figure 15B:
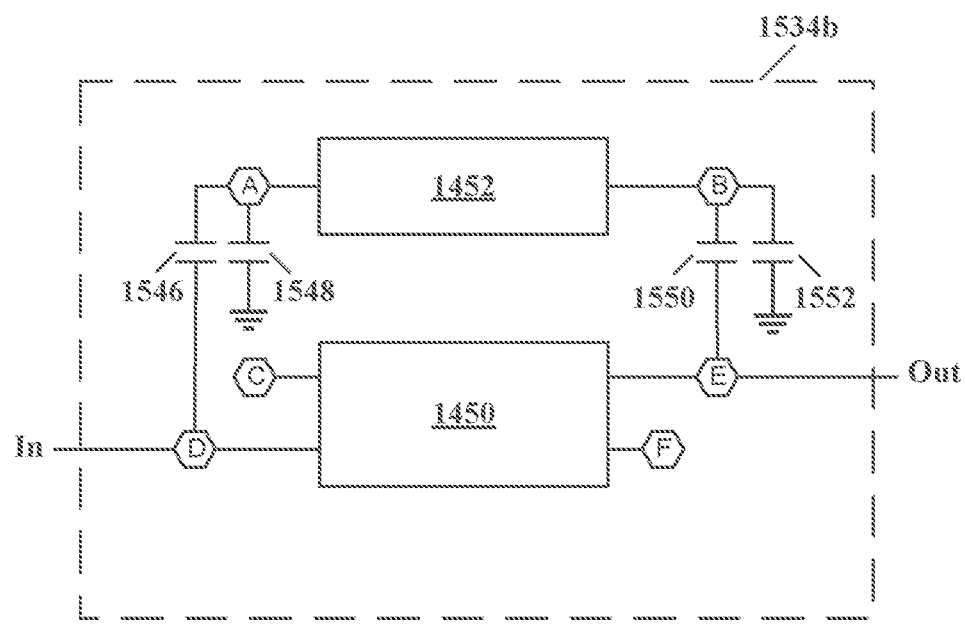

Referring to FIGS. 15A and 15B, depicted are schematic diagrams of the plurality of capacitors and inductors shown in FIG. 14 configured as low pass and high pass matching networks, according to specific example embodiments of this disclosure. FIG. 15A illustrates a low pass filter configuration matching network 1534*a* wherein the variable inductance 1452 may be coupled between the RF source (In—node A) and RF load (Out—node B). When all of the plurality of relay contacts 1440 are closed nodes A and B are connected together with substantially no inductance therebetween, and when relay contacts 1142 are open there is substantially no capacitance coupled to nodes C or E whereby the matching network 1534*a* may be effectively bypassed for ALE receive channel scanning. Relay contacts 1544 may be configured as a two-pole double throw relay wherein one contact is normally open (1544*a*) and another contact is normally closed (1544*b*). The variable capacitor 1450 may be coupled to either the RF load side of the variable inductor 1452 (node B) or the RF source side of the variable inductor 1452 (node A). When the RF load impedance is greater than the RF source impedance the variable capacitor 1450 may be coupled to node B, and when the RF load impedance is less than the RF source impedance the variable capacitor 1450 may be coupled to node A. When the RF source and load impedances are substantially the same the matching network 1534*a* may be bypassed as described hereinabove.

FIG. 15B illustrates a high pass filter configuration matching network 1534*b* wherein the variable capacitor 1450 may be coupled between the RF source (In—node D) and RF load (Out—node E). The capacitance thereof may be selected by closing selected ones of the plurality of relay contacts 1442. The variable inductor may be coupled to either the RF source or the RF load. When the RF load impedance is greater than the RF source impedance the variable inductor 1452 may be coupled to node E by closing relay contact 1550 and ground by closing relay contact 1548, and when the RF load impedance is less than the RF source impedance the variable inductor 1452 may be coupled to node D by closing relay contact 1546 and ground by closing relay contact 1552. When the RF source and load impedances are substantially the same matching network 1534*b* may be bypassed by closing relay contacts 1546 and 1550 (relay contacts 1440 are closed and relay contacts 1442 open), relay contacts 1548 and 1552 are open. This bypass configuration may also be used for ALE receive channel scanning.

Figure 15C:
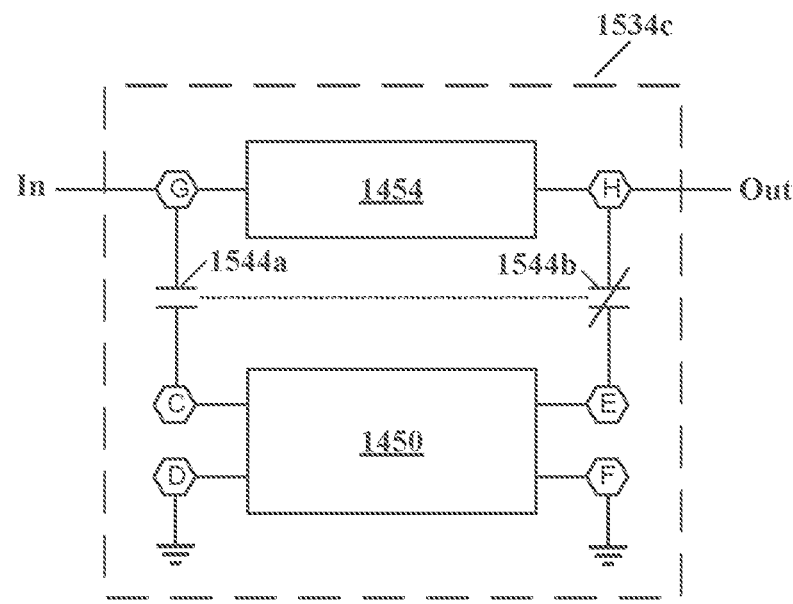
Figure 15D:
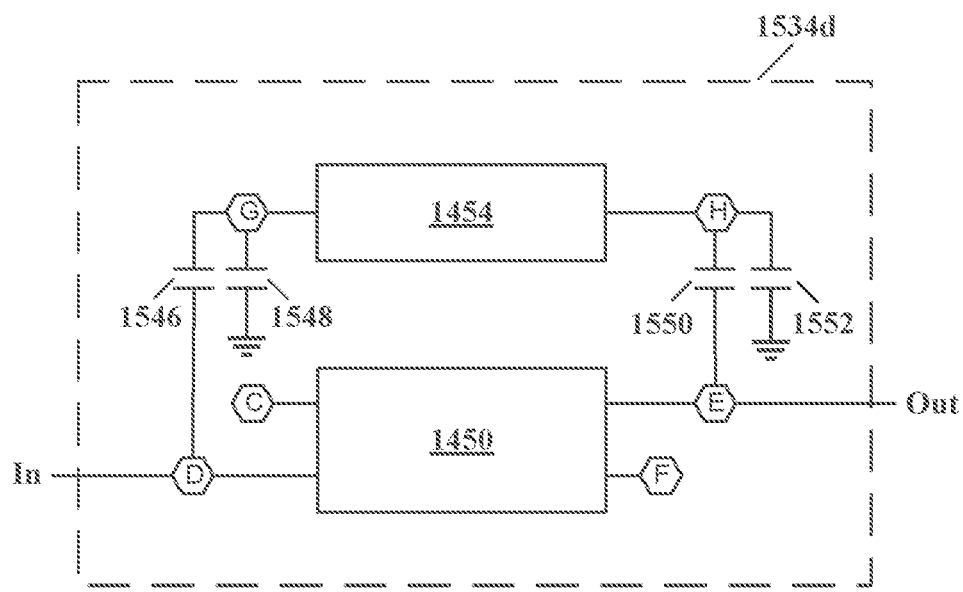
Figure 16A:
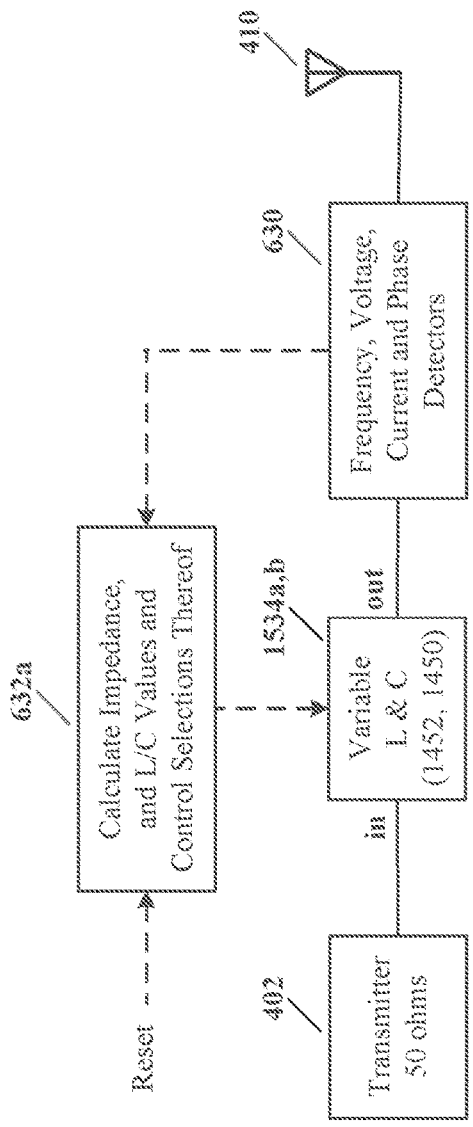
FIGS. 16A-16D, 17A-17D and 19A-19D illustrate schematic block diagrams of automatic operation antenna couplers, according to specific example embodiments of this disclosure.

Referring to FIGS. 15C and 15D, depicted are schematic diagrams of the plurality of capacitors and inductors shown in FIG. 14 configured as low pass and high pass matching networks, according to specific example embodiments of this disclosure. FIG. 15C illustrates a low pass filter configuration matching network 1534*c* wherein the variable inductance 1454 may be coupled between the RF source (In—node G) and RF load (Out—node H). When all of the plurality of relay contacts 1444 are open there is a maximum inductive impedance between nodes A and B, e.g., the sum of the series connected plurality of inductors 1408, and when relay contacts 1142 are open there is substantially no capacitance coupled to nodes C or E. An external relay contact coupled between nodes G and H may effectively bypass the matching network 1534c for ALE receive channel scanning. Relay contacts 1544 may be configured as a two-pole double throw relay wherein one contact is normally open (1544a) and another contact is normally closed (1544b). The variable capacitor 1450 may be coupled to either the RF load side of the variable inductor 1452 (node H) or the RF source side of the variable inductor 1452 (node G). When the RF load impedance is greater than the RF source impedance the variable capacitor 1450 may be coupled to node H, and when the RF load impedance is less than the RF source impedance the variable capacitor 1450 may be coupled to node G. When the RF source and load impedances are substantially the same the matching network 1534c may be bypassed with an external relay contact as more fully described hereinafter.

FIG. 15C illustrates a high pass filter configuration matching network 1534d wherein the variable capacitor 1450 may be coupled between the RF source (In—node D) and RF load (Out—node E). The capacitance thereof may be selected by closing selected ones of the plurality of relay contacts 1442. The variable inductor may be coupled to either the RF source or the RF load. When the RF load impedance is greater than the RF source impedance the variable inductor 1454 may be coupled to node E by closing relay contact 1550 and ground by closing relay contact 1548, and when the RF load impedance is less than the RF source impedance the variable inductor 1454 may be coupled to node D by closing relay contact 1546 and ground by closing relay contact 1552. When the RF source and load impedances are substantially the same the matching network 1534d may be bypassed with an external relay contact as more fully described hereinafter. This bypass configuration may also be used for ALE receive channel scanning.

Referring to FIGS. 16A-16D, depicted are schematic block diagrams of automatic operation antenna couplers, according to specific example embodiments of this disclosure. The antenna couplers shown in FIGS. 16A, 16B, 16C and 16D function substantially the same as described hereinabove for the antenna couplers shown in FIGS. 6A, 6B, 6C and 6D, respectively, the only differences are (1) the 1:N step-up impedance transformer 636 is not used, and (2) the calculation and selection control circuit 632a will also determine and select whether the shunt reactance (variable capacitor 1450 of matching network 1534a, or variable inductor 1452 of matching network 1534b) is coupled to the RF source or RF load, or the matching network is put into bypass, e.g., ALE receive channel scanning or RF source and load impedances are substantially the same.

The shunt reactance will be coupled to the RF load when the RF load impedance is greater than the RF source impedance, and to the RF source when the RF load impedance is less than the RF source impedance. Step 850 of the operational flow diagrams shown in FIGS. 8A, 8B and 8C will further determine whether the shunt reactance is coupled to the RF load or to the RF source of the antenna couplers shown in FIGS. 16A, 16B, 16C and 16D.

Figure 17A:
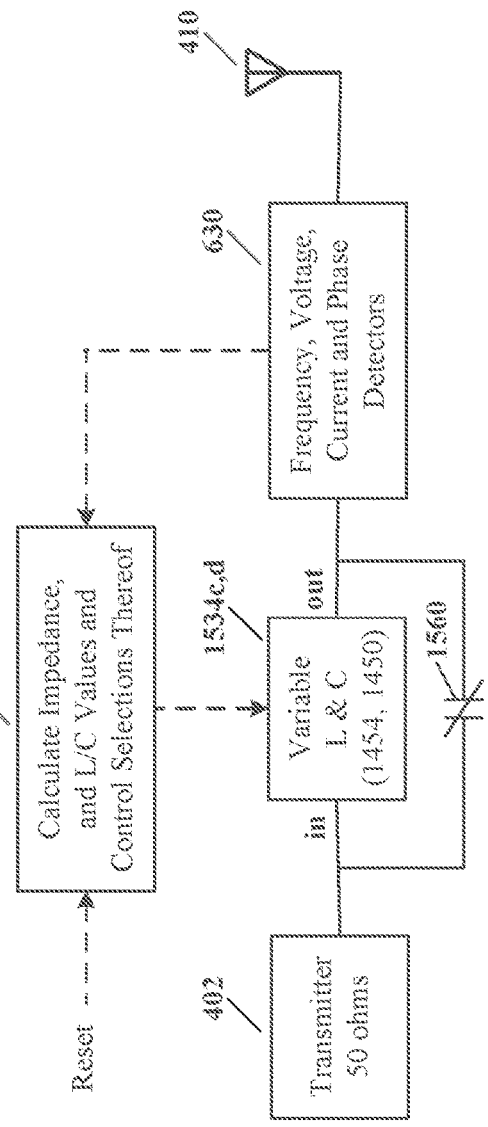
Figure 16B:
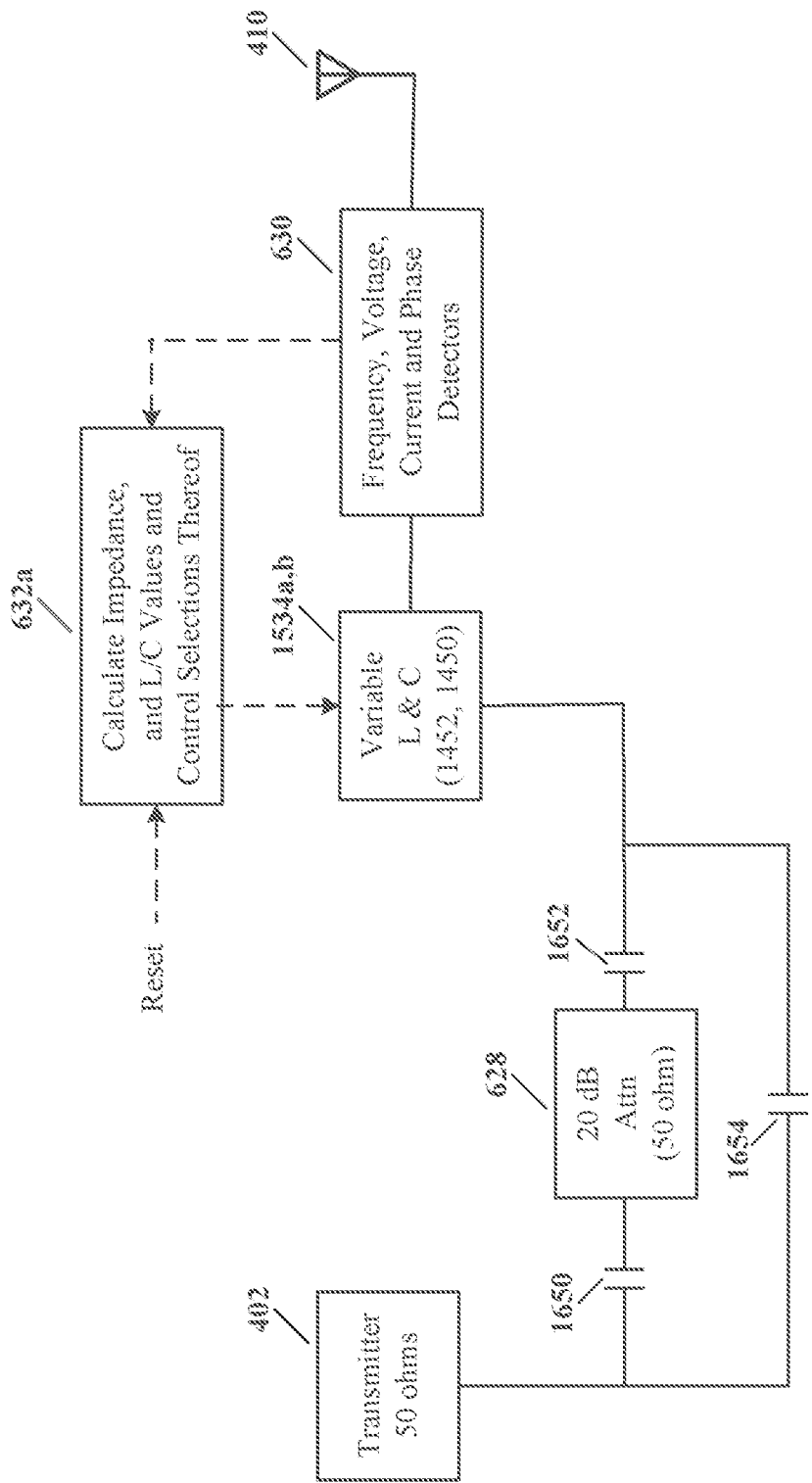
Figure 16C:
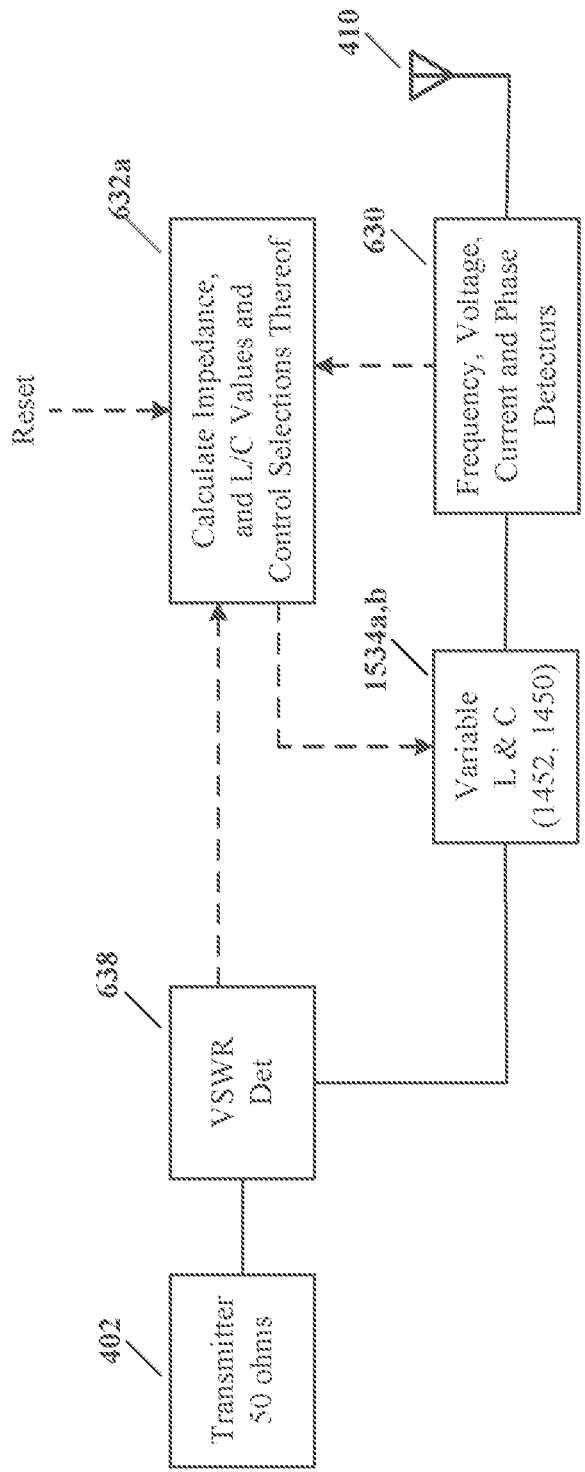
Figure 16D:
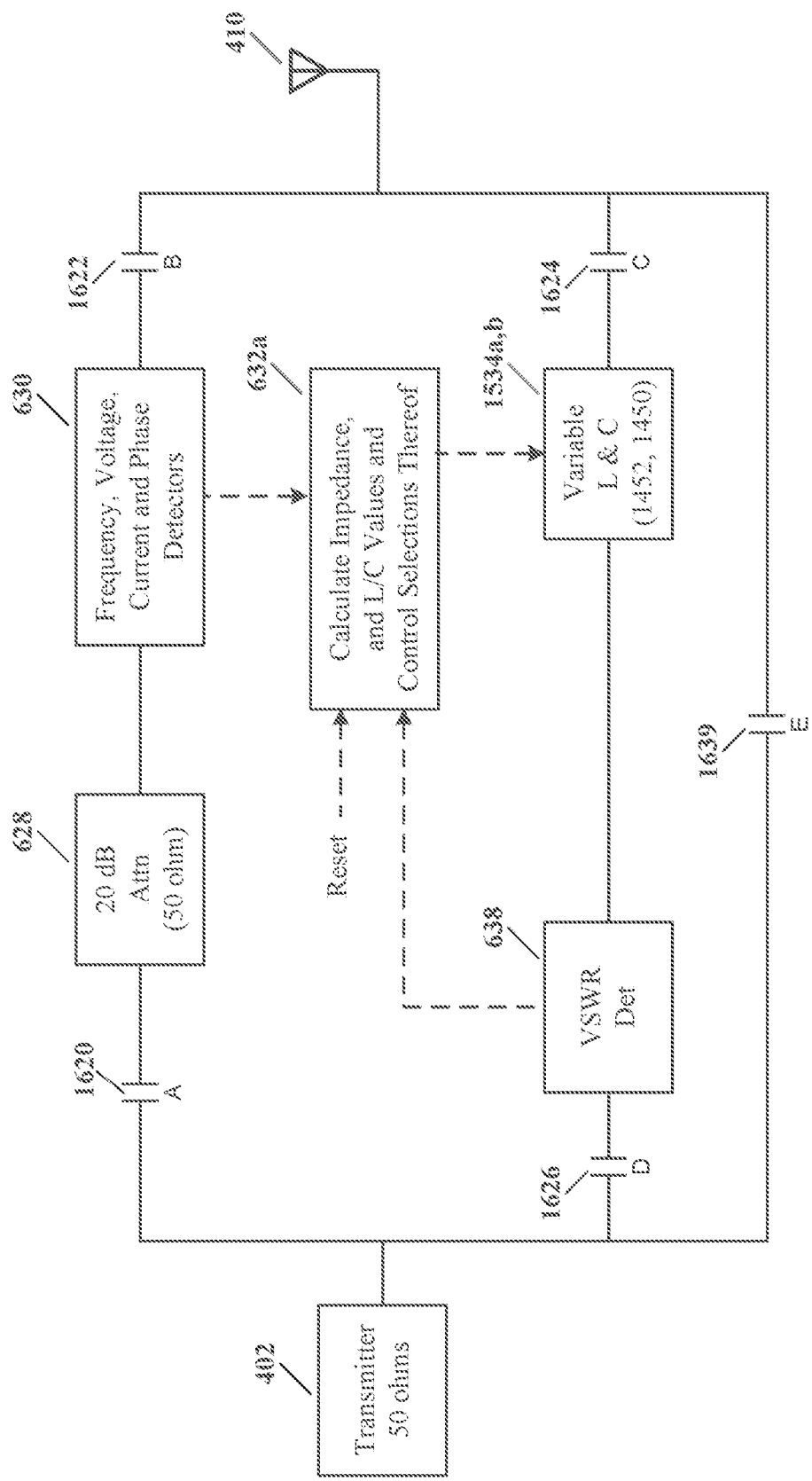

Referring to FIG. 17A, depicted is a schematic block diagram of an automatic operation antenna coupler, according to specific example embodiments of this disclosure. The antenna coupler shown in FIG. 17A may comprise a matching network 634 comprising configurable values of inductance 1454 and capacitance 1450, a bypass relay contact 1560; frequency, voltage, current and phase detectors 630; and a calculation and selection control circuit 632b. The antenna coupler shown in FIG. 17A functions substantially the same as the antenna coupler shown in FIG. 16A with the addition of the bypass relay contact 1560 and the plurality of relay contacts 1444 being normally open instead of the normally closed plurality of relay contacts 1440. An advantage of providing the bypass relay contact 1560 is that most of the RF power is diverted or bypassed around the matching network 1534c,d during selection of the inductors 1408 and capacitors 1442 for a match condition between the RF load 410 and the RF source 402. When the desired relay contacts 1442 and 1444 have been operationally selected, then the bypass relay contact 1560 may open and then the fully configured matching network 1534c,d will be coupled between the RF load 410 and RF source 402. This may substantially reduce relay contact 1442 and 1444 wear since substantially no RF voltage and current are present during the selected relay contact closing operation.

Figure 17B:
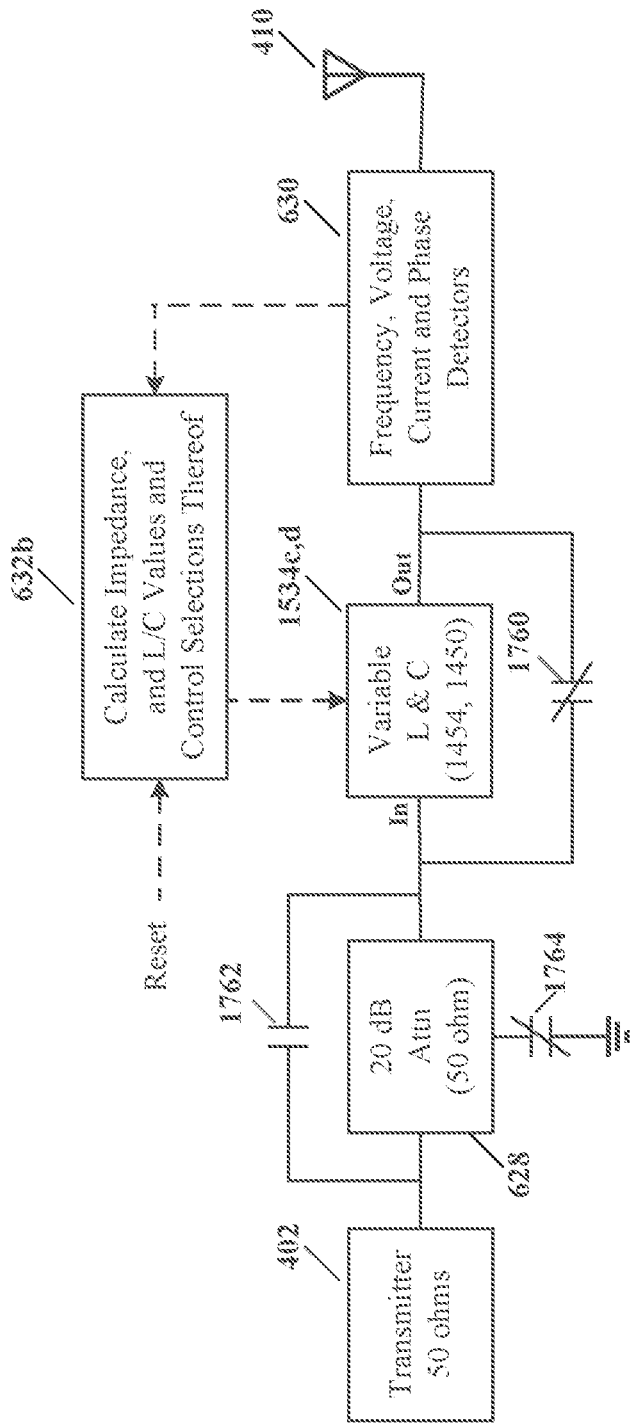

Referring to FIG. 17B, depicted is a schematic block diagram of an automatic operation antenna coupler, according to specific example embodiments of this disclosure. The antenna coupler shown in FIG. 17B is substantially similar in configuration and operation as the antenna coupler of FIG. 17A, and further comprises a RF attenuator 628 and associated relay contacts 1762 and 1764. The attenuator 628 may be coupled between the transmitter (RF source) 402 and the matching network 1534c,d. The RF attenuator 628 may provide a more uniform impedance load to the transmitter 402 and reduce RF power during configuring the variable inductance (1454) and variable capacitance (1450) of the matching network 1534c,d. Once the matching network 1534c,d has been configured, the relay contact 1760 may open and then the RF attenuator 628 may be effectively removed by closing relay contact 1762 and opening relay contact 1764, thereby coupling the RF source 402 directly to the input of the matching network 1534c,d. The matching network 1534c,d and attenuator 628 will very briefly be coupled in series during the relay contact transitions. But this does not present a significant mismatch as the RF source 402 will only briefly see a 100-ohm load or a VSWR of 2:1.

Figure 17C:
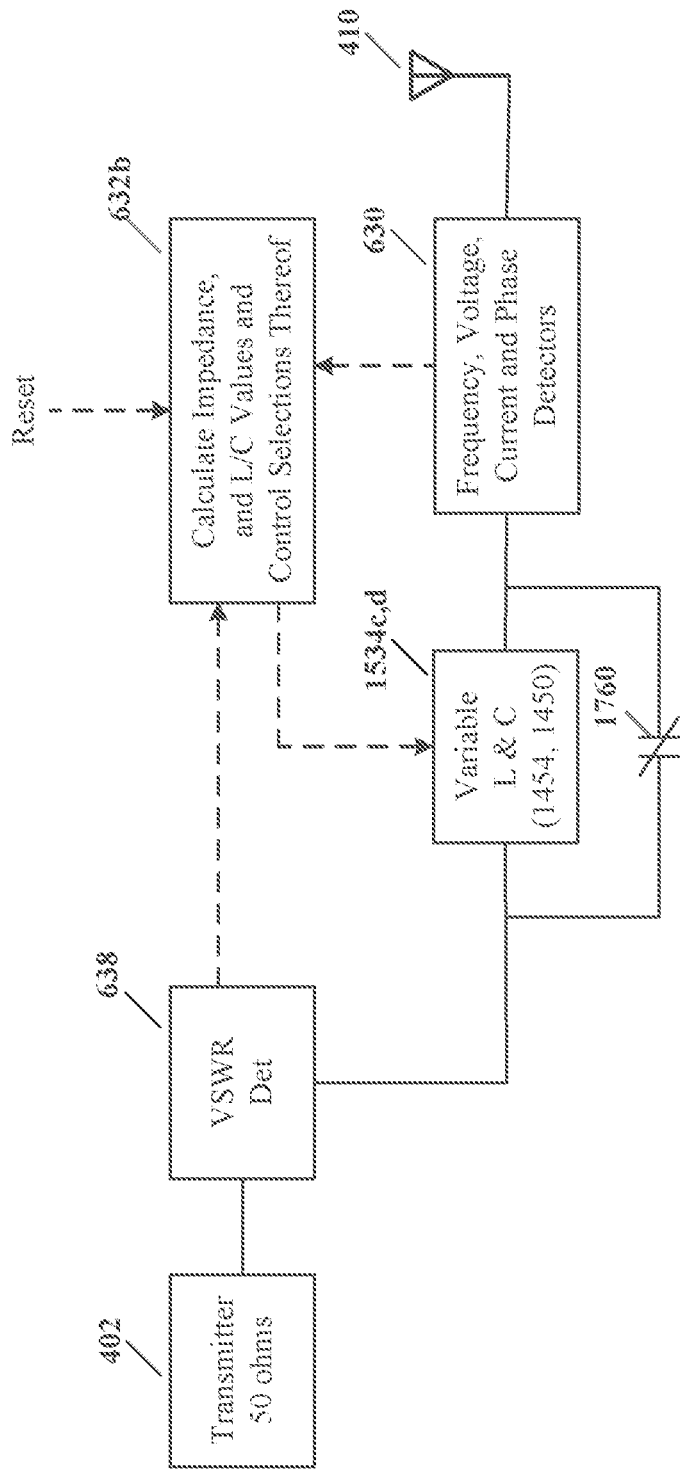

Referring to FIG. 17C, depicted is a schematic block diagram of an automatic operation antenna coupler, according to specific example embodiments of this disclosure. The antenna coupler shown in FIG. 17C is substantially similar in configuration and operation as the antenna coupler of FIG. 17A, and further comprises a voltage standing wave (VSWR) detector 638 coupled between the transmitter 402 and the matching network 1534c,d. The VSWR detector 638 may be used to monitor proper operation of the matching network 1534c,d, and if a high VSWR is detected then alarm and/or take some action like telling the calculation and control circuit 632b to initiate a new match operation.

Figure 17D:
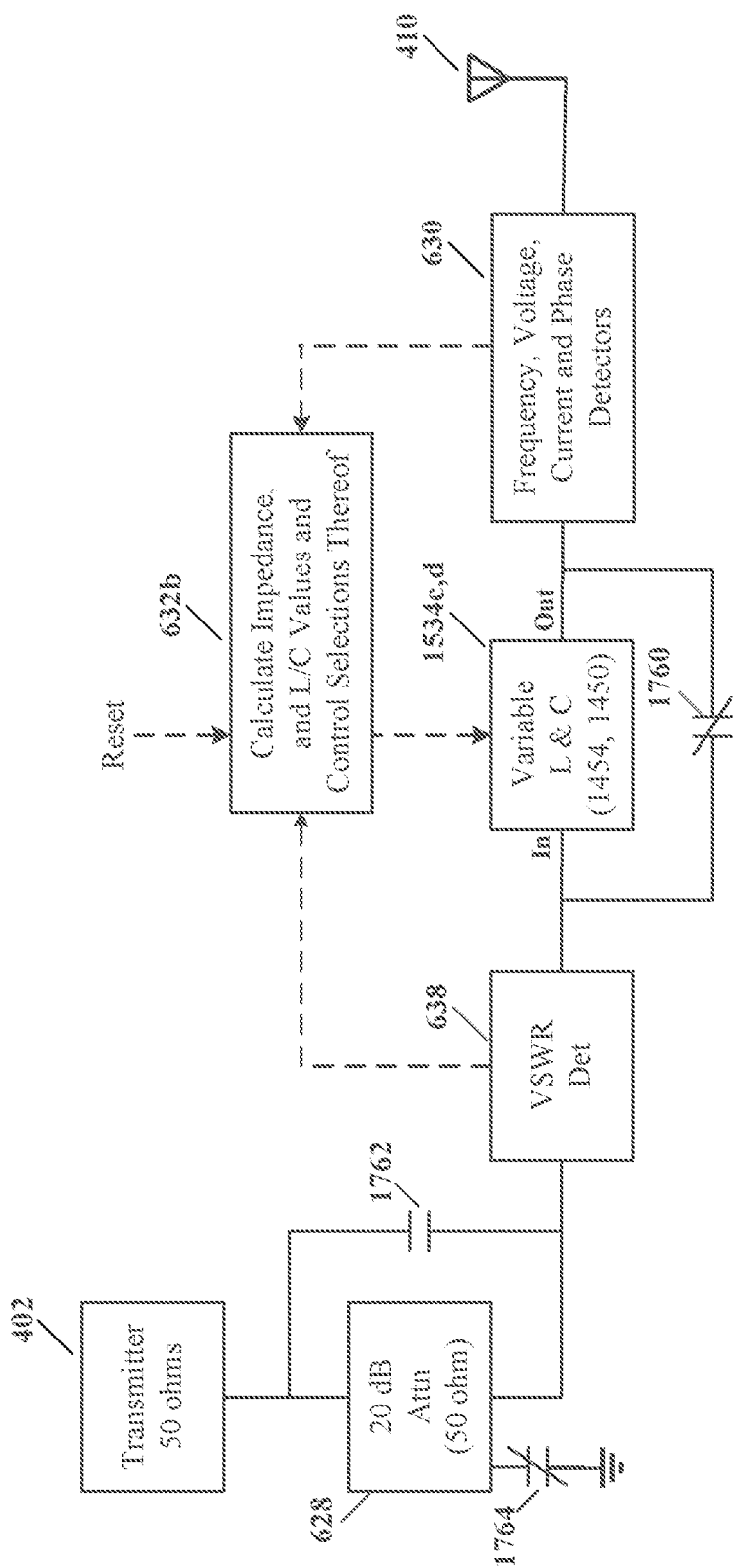
Figure 18A:
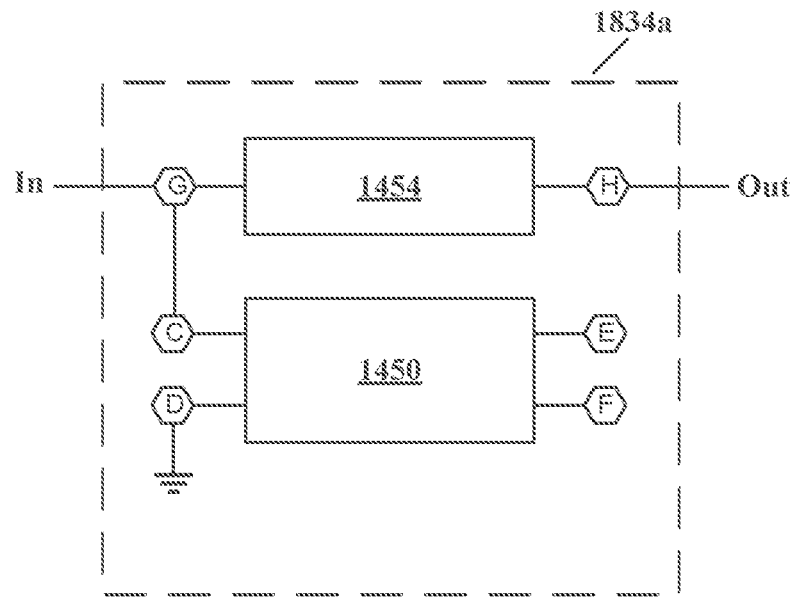
Figure 18B:
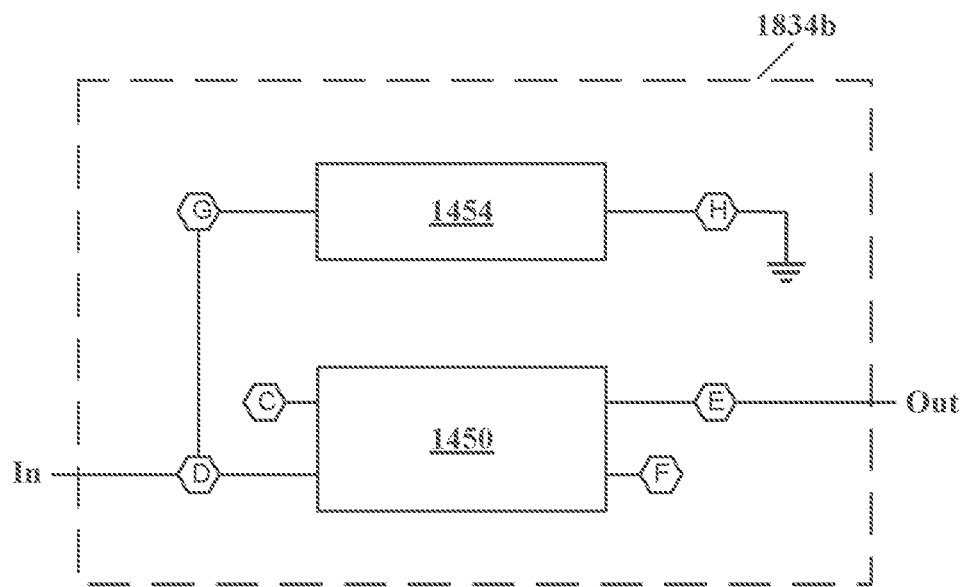

Referring to FIG. 17D, depicted is a schematic block diagram of an automatic operation antenna coupler, according to specific example embodiments of this disclosure. The automatic operation antenna coupler shown in FIG. 17D is substantially similar in configuration and operation as the antenna couplers shown in of FIGS. 17B and 17C, Referring to FIGS. 18A and 18B, depicted are schematic diagrams of the plurality of capacitors and inductors shown in FIG. 14 configured as low pass and high pass matching networks, according to specific example embodiments of this disclosure. FIG. 18A illustrates a low pass filter configuration matching network 1834a wherein the variable inductance 1454 may be coupled between the RF source (In—node G) and RF load (Out—node H). When all of the plurality of relay contacts 1444 are open there is a maximum inductive impedance between nodes A and B, e.g., the sum of the series connected plurality of inductors 1408, and when relay contacts 1142 are open there is substantially no capacitance coupled to nodes C or E. An external relay contact coupled between nodes G and H may effectively bypass the matching network 1534*c* for ALE receive channel scanning. Relay contacts 1544 may be configured as a two-pole double throw relay wherein one contact is normally open (1544*a*) and another contact is normally closed (1544*b*). The variable capacitor 1450 may be coupled to RF source side of the variable inductor 1452 (node G). The matching network 1834*a* may be bypassed with an external relay contact as more fully described herein.

FIG. 18B illustrates a high pass filter configuration matching network 1834*b* wherein the variable capacitor 1450 may be coupled between the RF source (In—node D) and RF load (Out—node E). The capacitance thereof may be selected by closing selected ones of the plurality of relay contacts 1442. The variable inductor 1454 node G may be coupled to the capacitor 1450 node D, node H thereof may be coupled to ground. The matching network 1834*b* may be bypassed with an external relay contact as more fully described herein.

Figure 19A:
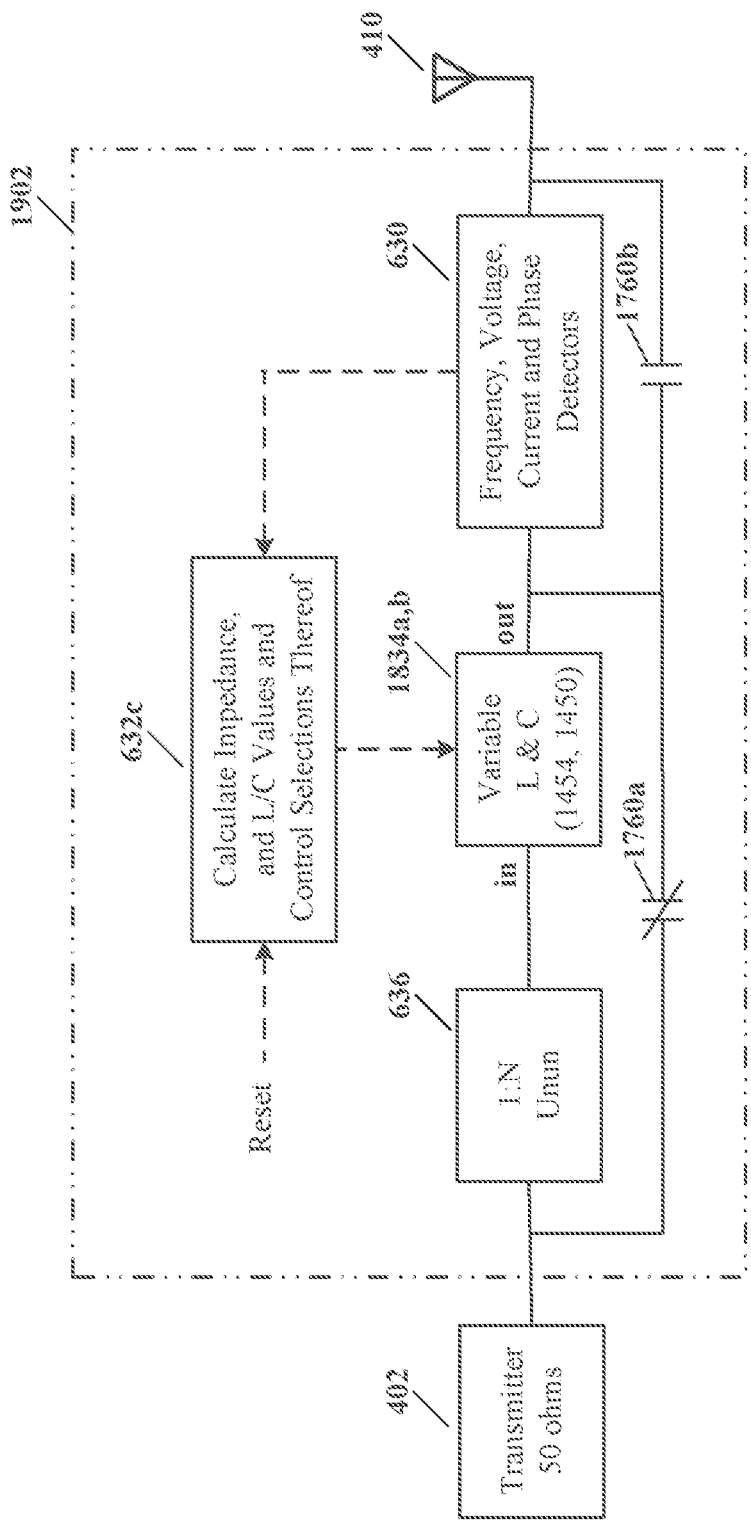

Referring to FIG. 19A, depicted is a schematic block diagram of an automatic operation antenna coupler, according to specific example embodiments of this disclosure. The antenna coupler shown in FIG. 19A may comprise a matching network 1834*a,b* comprising configurable values of inductance 1454 and capacitance 1450, 1:N step-up impedance transformer 636, a bypass relay contact 1760; frequency, voltage, current and phase detectors 630; and calculation and selection control circuit 632*c*. The antenna coupler shown in FIG. 19A functions substantially the same as the antenna coupler shown in FIG. 6A with the addition of the bypass relay contact 1760*a* and the plurality of relay contacts 1444 being normally open instead of the normally closed plurality of relay contacts 1440. An advantage of providing the bypass relay contact 1760*a* is that most of the RF power is diverted or bypassed around the 1:N step-up impedance transformer 636 and the matching network 1834*a,b* during configuration of the variable inductance 1454 and the variable capacitance 1450 for a match condition between the RF load 410 and the RF source 402. After the desired relay contacts 1442 and 1444 have been operationally selected the bypass relay contact 1760*a* may open, whereby the fully configured matching network 1834*a,b* will be coupled between the RF load 410 and RF source 402. This may substantially reduce wear on the relay contacts 1442 and 1444 since substantially no RF voltage and current are present during the selected relay contact closing operation. An additional relay contact 1760*b* may be provided to bypass (short out) the frequency, voltage, current and phase detectors 630 for enhanced protection from high RF power being applied to the RF load 410.

Figure 19B:
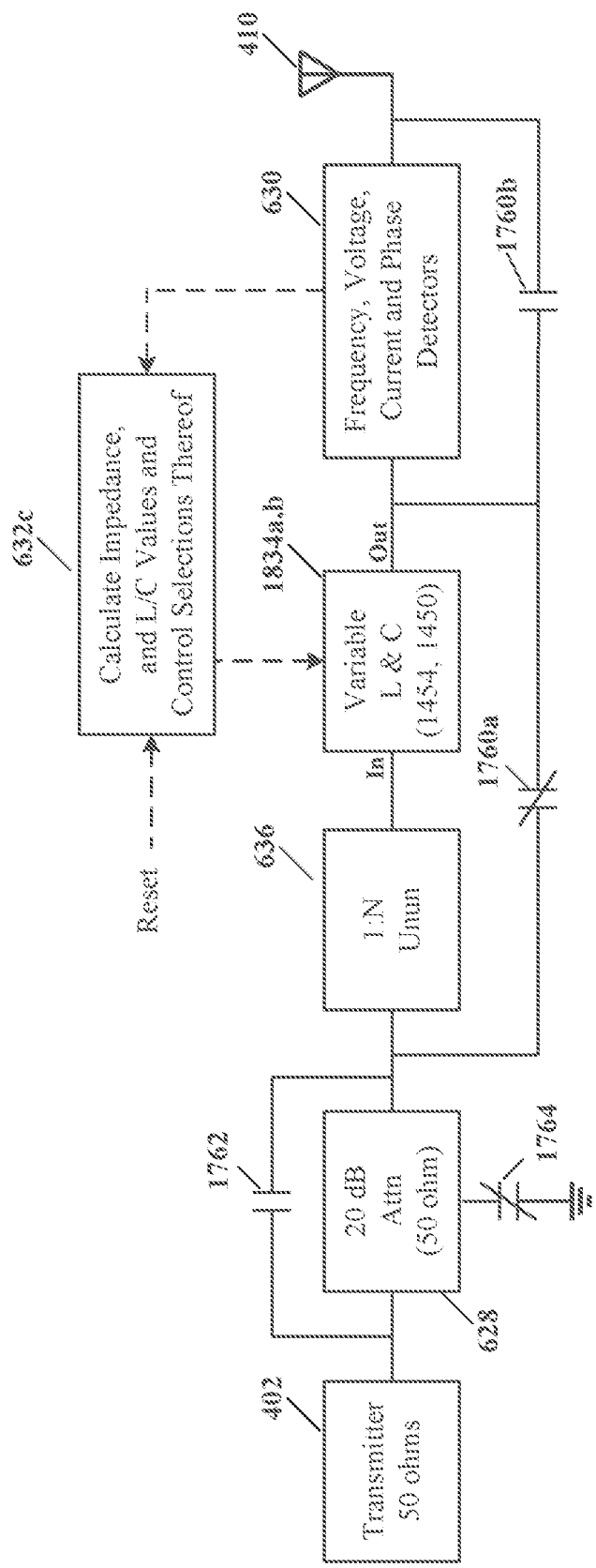

Referring to FIG. 19B, depicted is a schematic block diagram of an automatic operation antenna coupler, according to specific example embodiments of this disclosure. The antenna coupler shown in FIG. 19B is substantially similar in configuration and operation as the antenna coupler shown in FIG. 19A, and further comprises a RF attenuator 628 and associated relay contacts 1762 and 1764. The attenuator 628 may be coupled between the transmitter (RF source) 402 and the 1:N step-up impedance transformer 636. The RF attenuator 628 may provide a more uniform impedance load to the transmitter 402 and reduce RF power during configuring the variable inductance (1454) and variable capacitance (1450) of the matching network 1834*a,b*. Once the matching network 1834*a,b* has been configured, the relay contact 1760*a* may open and then the RF attenuator 628 may be effectively removed by closing relay contact 1762 and opening relay contact 1764, thereby coupling the RF source 402 directly to the input of the matching network 1534*c,d*. The matching network 1834*a,b* and attenuator 628 will very briefly be coupled in series during the relay contact transitions. But this does not present a significant mismatch as the RF source 402 will only briefly see a 100-ohm load or a VSWR of 2:1. An additional relay contact 1760*b* may be provided to bypass (short out) the frequency, voltage, current and phase detectors 630 for enhanced protection from high RF power being applied to the RF load 410.

Figure 19C:
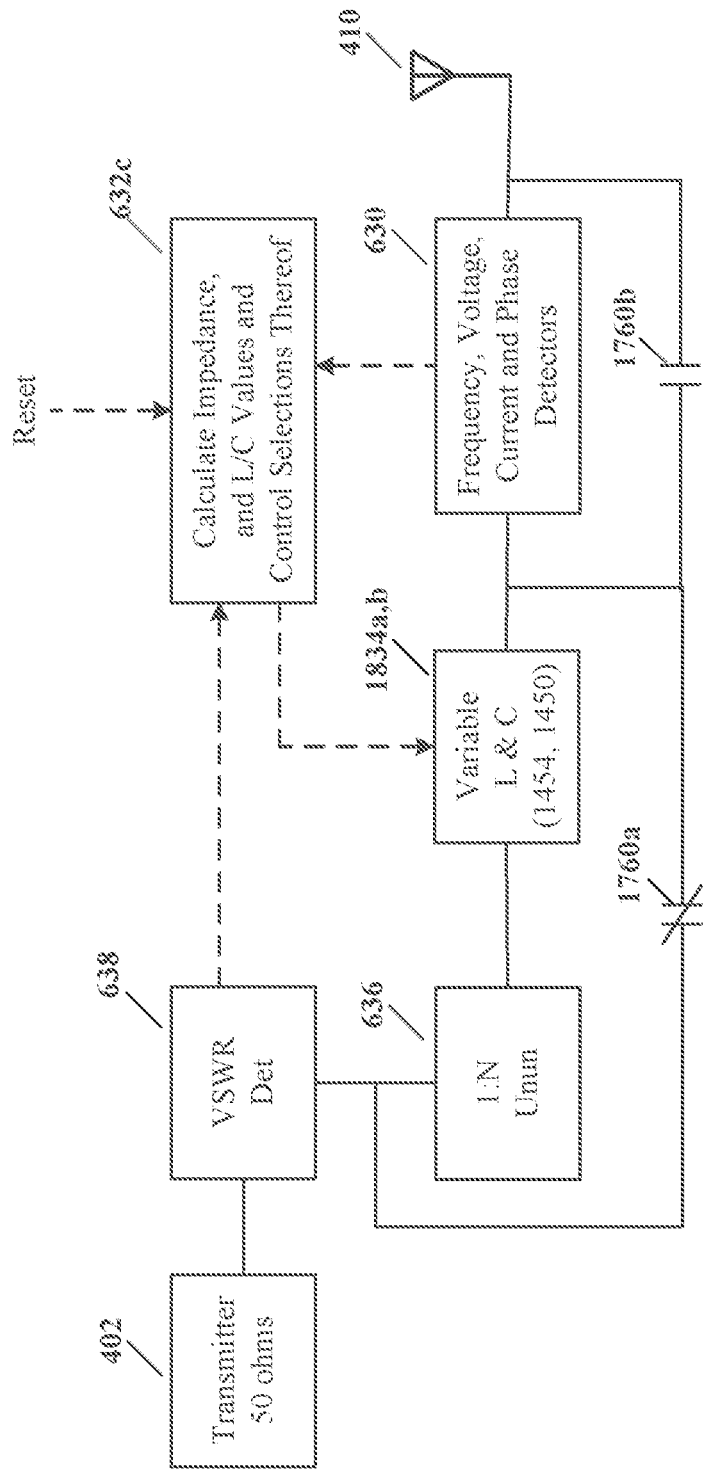

Referring to FIG. 19C, depicted is a schematic block diagram of an automatic operation antenna coupler, according to specific example embodiments of this disclosure. The antenna coupler shown in FIG. 19C is substantially similar in configuration and operation as the antenna coupler of FIG. 19A, and further comprises a voltage standing wave (VSWR) detector 638 coupled between the transmitter 402 and the 1:N step-up impedance transformer 636. The VSWR detector 638 may be used to monitor proper operation of the matching network 1834*b,c*, and if a high VSWR is detected then alarm and/or take some action like telling the calculation and control circuit 632*c* to initiate a new match operation. An additional relay contact 1760*b* may be provided to bypass (short out) the frequency, voltage, current and phase detectors 630 for enhanced protection from high RF power being applied to the RF load 410.

Figure 19D:
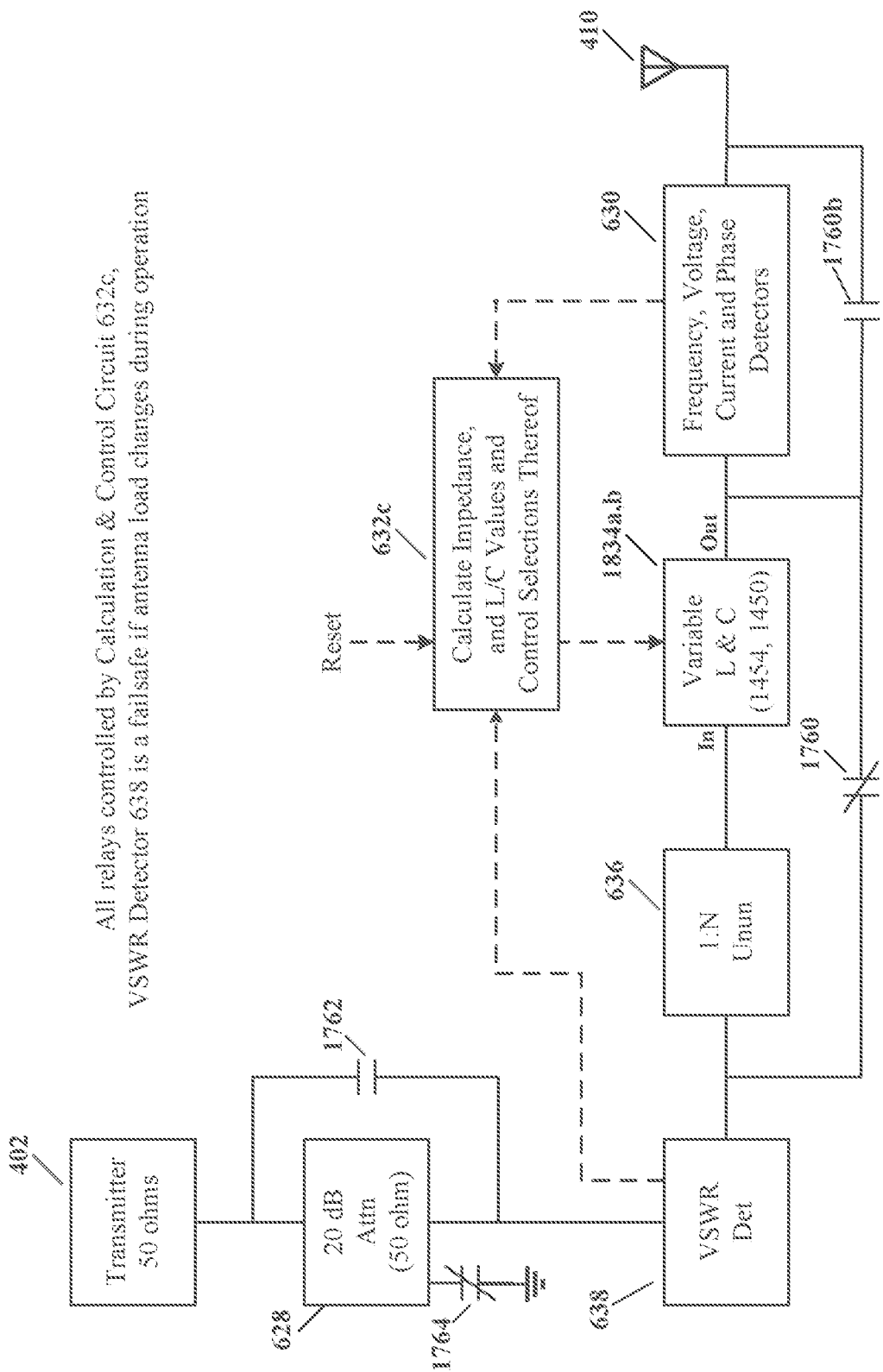

Referring to FIG. 19D, depicted is a schematic block diagram of an automatic operation antenna coupler, according to specific example embodiments of this disclosure. The automatic operation antenna coupler shown in FIG. 19D is substantially similar in configuration and operation as the antenna couplers shown in of FIGS. 19B and 19C. An additional relay contact 1760*b* may be provided to bypass (short out) the frequency, voltage, current and phase detectors 630 for enhanced protection from high RF power being applied to the RF load 410.

Figure 20:
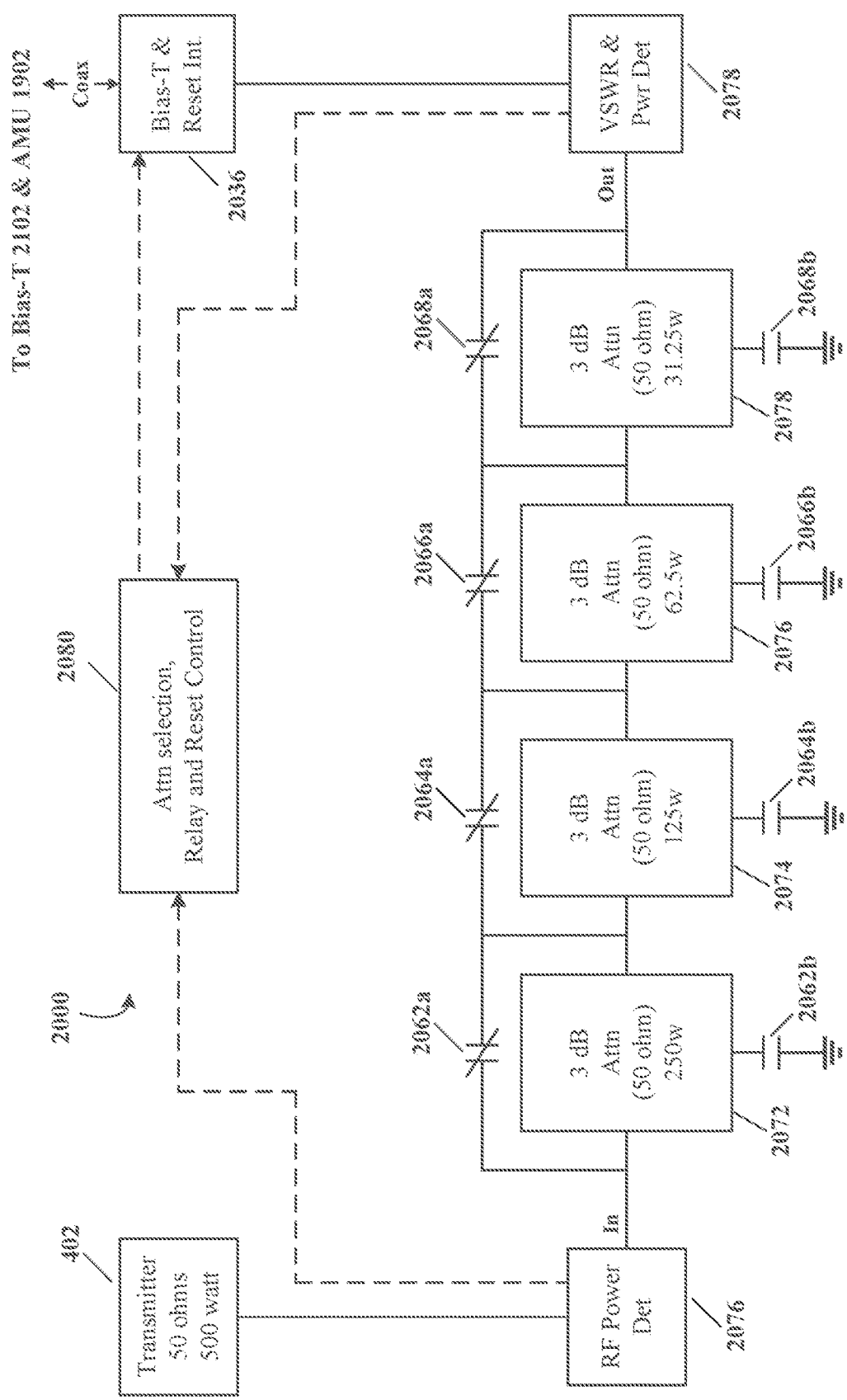
FIG. 20 illustrates a schematic block diagram of an automatic RF attenuator, according to specific example embodiments of this disclosure.

Referring to FIG. 20, depicted is a schematic block diagram of an automatic RF attenuator, according to specific example embodiments of this disclosure. An automatic RF attenuator, generally represented by the numeral 2000, may comprise a plurality of RF attenuators, represented by, for example but not limited to, the numerals 2072-2078; a plurality of relays (contacts) represented by, for example but not limited to, the numerals 2062-2068; an input RF power detector 2076, a VSWR and RF power detectors 2078, and an attenuator selection and relay and reset controller 2080. In addition, a bias-T and reset initiate interface 2036 may also be coupled to the attenuator 2000 and an AMU 1902.

Shown are 3 dB attenuators for description purposes, but any attenuation value may be used and is contemplated in this disclosure. The plurality of relays (contacts) 2062-2068 may be used to insert or bypass an associated RF attenuator. When an RF attenuator is inserted it will drop the RF power in half and the total attenuation of the RF signal power is the sum of the attenuators inserted. The attenuator selection and relay and reset controller 2080 receives RF input power information from the input RF power detector 2076, and output RF power and VSWR information from the VSWR and RF power detectors 2078. At least one of the RF attenuators may be inserted into the RF power path when, for example but not limited to, the input RF power is greater than 50 watts and a VSWR of greater than 2:1 is detected. Then once an appropriate number of attenuators 2072-2078 have been inserted to reduce the RF power to the AMU 1902, a reset initiate signal may be sent to the AMU 1902 for it to do a new impedance match. Thus, the automatic RF attenuator may prevent damage to the AMU 1902 when there is a high VSWR>2:1 and the RF source is applying full RF power, e.g., 500 watts. Once there is a new match condition and the VSWR drops below 2:1 the inserted ones of the plurality of attenuators may be bypassed and full RF power applied to the RF load that is now properly matched to the impedance of the RF source. The bias-T and reset initiate interface 2036 may be used to supply RF and DC power, and the reset initiate signal to the AMU 1902 over a single coaxial cable.

Figure 21:
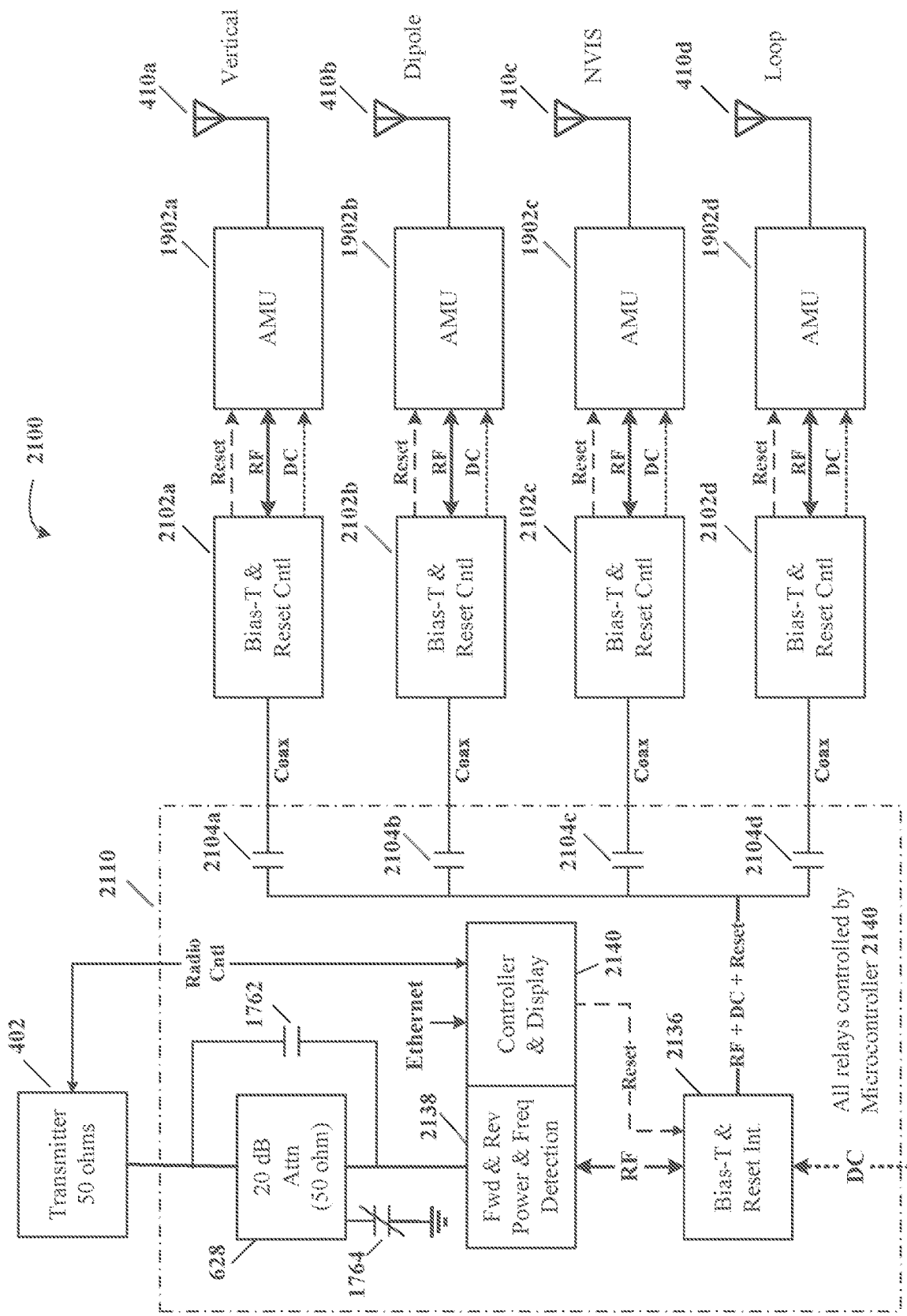
FIG. 21 illustrates a schematic block diagram of a plurality of remote automatic operation antenna couplers located proximate to respective antennas and a base station control unit, according to specific example embodiments of this disclosure.

Referring to FIG. 21, depicted is a schematic block diagram of a plurality of remote automatic operation antenna couplers located proximate to respective antennas and a base station control unit, according to specific example embodiments of this disclosure. A base station radio system, generally represented by the numeral 2100, may comprise a plurality of antennas 410, a plurality of antenna matching units (AMUS) 1902, a plurality of bias-T and reset control interfaces 2102, a base station interface and controller 2110, and a radio transmitter (transceiver) 402.

The base station interface and controller 2110 may comprise forward and reflected power measurement and frequency detection 2138, a controller and display 2140, such as, for example but not limited to, a microcontroller, an attenuator 628, attenuator relay contacts 1762 and 1764, a plurality of RF switching relay contacts 2104, and a bias-T and reset initiate interface 2136. The controller display 2140 may be a color touch screen for monitoring the station RF parameters, e.g., RF power, VSWR, selected antenna; and inputting control and information for station operation. The base station interface and controller 2110 may be adapted to couple with a transmitter for receiving operating information such AMU match initiation, antenna selection, and/or the Internet for other useful information, e.g., time of day, date, weather, radio frequency band conditions, ionosphere skip layer information, sun spot activity, gray line information, radio signal propagation monitoring, etc.

The base station interface and controller 2110 may be programmed to select a particular antenna based upon the frequency of the transmitter 402 and may also in combination with the time of day, season, solar activity and/or distance between the base station and a desired receiving site(s). It may also be configured for automatic link establishment (ALE) using selected ones or the plurality of antennas 410 for different frequencies and/or communications distances.

The bias-T and reset initiate interface 2136 may be used to supply RF and DC power to a selected AMU 1902, and to also instruct the selected AMU 1902 to do a match operation. The bias-T and reset control interfaces 2102 may couple RF and DC power to the respective AMU 1902 and may provide a reset (match initiate) signal to the AMU 1902. Selection of AMUs 1902 may be based upon at least one criteria such frequency, communications distance, time of day, season, sunspot activity, ionization layer status, etc. The criteria parameters may be programmed into the base station interface and controller 2110 with the touch screen display 2140, over a computer connection such as the Ethernet, or even the Internet. Thus, automatic selection of antennas 410 and matching thereto may be performed with the base station interface and controller 2110 and plurality of AMUs 1902.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

What is claimed:

1. A system for matching an impedance of a radio frequency (RF) load to an impedance of a RF source, said system comprising:
    a frequency detector for determining a frequency of a RF source;
    voltage, current and phase detectors for determining voltage, current and phase of a RF load;
    a RF attenuator having an input coupled to the RF source and an output coupled to the frequency, voltage, current and phase detectors;
    an impedance matching network coupled to the RF attenuator, frequency, voltage, current and phase detectors and to the RF load, wherein the impedance matching network comprises a variable capacitor and a variable inductor;
    a measurement, calculation and control circuit coupled to the frequency, voltage, current and phase detectors, and the variable capacitor and the variable inductor;
    wherein from the frequency of the RF source and the voltage, current and phase of the RF load, the measurement, calculation and control circuit calculates capacitance and inductance values required for the variable capacitor and the variable inductor to match the impedance of the RF load to the RF source impedance, and then sets the variable capacitor and the variable inductor to the capacitance and inductance values, respectively;
    a first switch coupled in parallel with the impedance matching network;
    a second switch coupled in parallel with the RF attenuator and frequency, voltage, current and phase detectors;
    wherein
        the first switch is closed during calculation of the capacitance and inductance values and setting of the variable capacitor and the variable inductor thereto, and open thereafter, and
        the second switch is open when the first switch is closed and closed when the first switch is open.

2. The system according to claim 1, wherein the impedance matching network is configured as a low pass filter whereby the variable capacitor is coupled at the RF source and the variable inductor is coupled between the RF source and the RF load.

3. The system according to claim 1, wherein the impedance matching network is configured as a high pass filter whereby the variable inductor is coupled at the RF source and the variable capacitor is coupled between the RF source and the RF load.

4. The system according to claim 1, wherein the variable inductor comprises a plurality of inductors having an inductance configured with a first plurality of switches that short out unused ones of the plurality of inductors, and the variable capacitor comprises a plurality of capacitors having a capacitance configured with a second plurality of switches that disconnect unused ones of the plurality of capacitors.

5. The system according to claim 4, wherein the first and second plurality of switches are a first and second plurality of relay contacts.

6. The system according to claim 1, wherein the RF source is a RF transmitter and the RF load is an antenna.

* * * * *